(12) United States Patent  
Ohtsuki

(10) Patent No.: US 8,068,158 B2
(45) Date of Patent: Nov. 29, 2011

(54) SOLID STATE IMAGING DEVICE CAPABLE OF PARALLEL READING OF DATA FROM A PLURALITY OF PIXEL CELLS

(75) Inventor: Hirohisa Ohtsuki, Hyogo (JP)

(73) Assignee: Panasonic Corporation, Osaka (JP)

( * ) Notice: Subject to any disclaimer, the term of this patent is extended or adjusted under 35 U.S.C. 154(b) by 441 days.

(21) Appl. No.: 12/429,768

(22) Filed: Apr. 24, 2009

(65) Prior Publication Data

US 2009/0290057 A1 Nov. 26, 2009

(30) Foreign Application Priority Data

May 21, 2008 (JP) ................................ 2008-132910

(51) Int. Cl.
*H04N 3/14* (2006.01)
(52) U.S. Cl. ...... 348/308; 348/302; 348/311; 250/208.1
(58) Field of Classification Search .......... 348/294–324; 250/208.1; 257/72, 290–294, 431–443
See application file for complete search history.

(56) References Cited

U.S. PATENT DOCUMENTS

| 7,547,872 | B2 * | 6/2009 | Niclass et al. ............. 250/214 R |
| 2003/0193595 | A1 * | 10/2003 | Henderson .................... 348/308 |
| 2005/0168618 | A1 | 8/2005 | Okita et al. |
| 2006/0226342 | A1 | 10/2006 | Sato et al. |
| 2008/0251693 | A1 * | 10/2008 | Lin ............................. 250/208.1 |
| 2009/0021625 | A1 | 1/2009 | Sowa et al. |

FOREIGN PATENT DOCUMENTS

| JP | 2006-295620 A | 10/2006 |
| JP | 2007-202035 A | 8/2007 |

* cited by examiner

*Primary Examiner* — Huy K Mai
(74) *Attorney, Agent, or Firm* — McDermott Will & Emery LLP

(57) ABSTRACT

A solid state imaging device has a pixel region composed of a matrix of pixel cells each including a photodiode and a charge storage portion. First and second output signal lines are in parallel and adjacent to both the charge storage portions of a first pixel cell and a second pixel cells that are adjacent on a same column. A signal voltage of a signal charge in the charge storage portion of the first pixel cell is output to the first output signal line, whereas a signal voltage of a signal charge in the charge storage portion of the second pixel cell is output to the second output signal line. The respective outputs to the first and second output signal lines are processed in parallel. A conductive layer is disposed between the charge storage portion of the first pixel cell and the second output signal line to suppress capacitive coupling.

10 Claims, 25 Drawing Sheets

FIG. 16
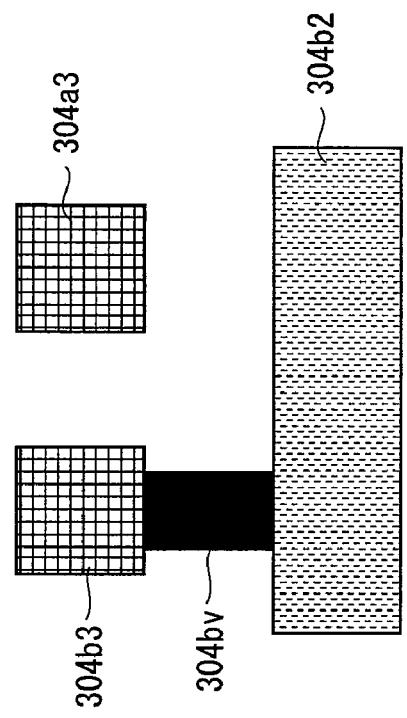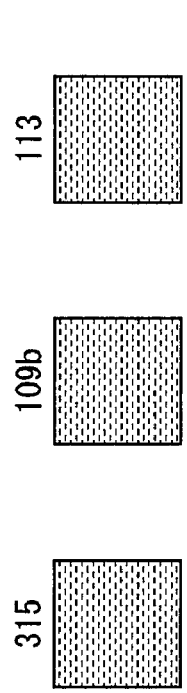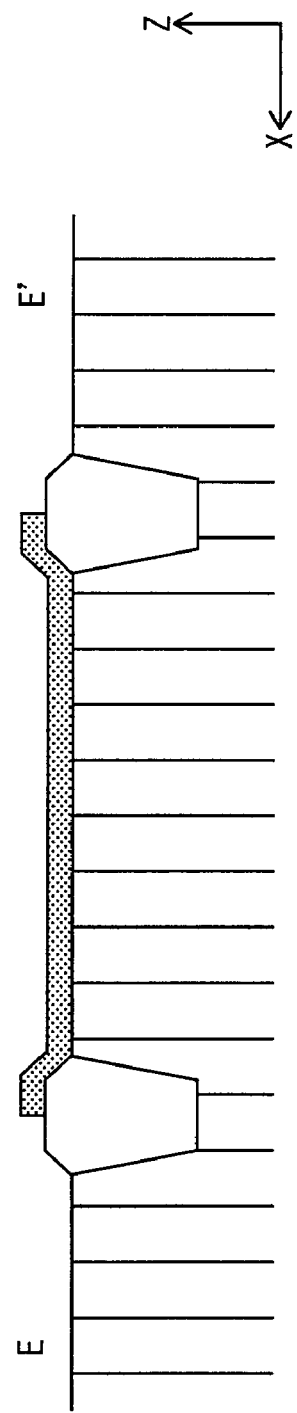

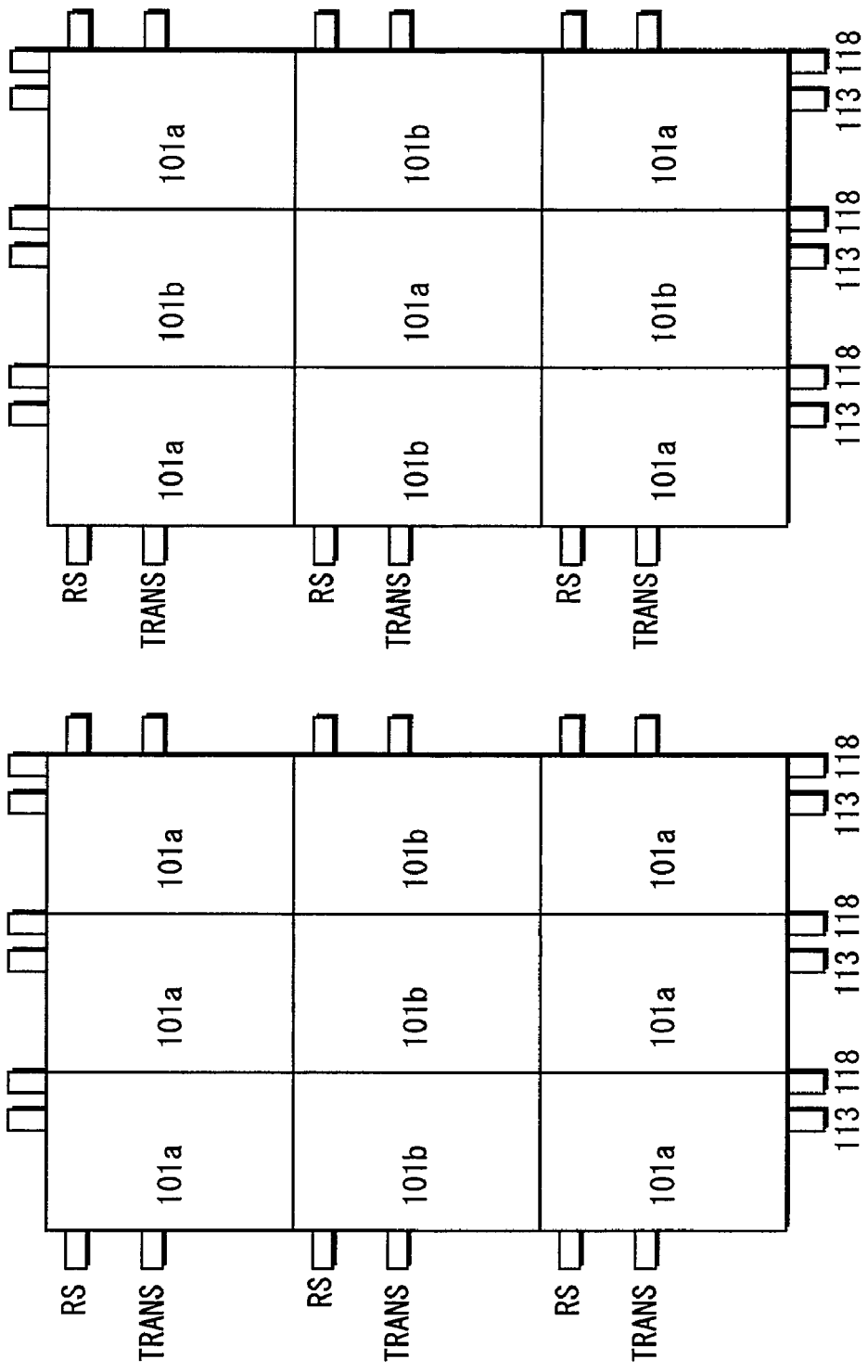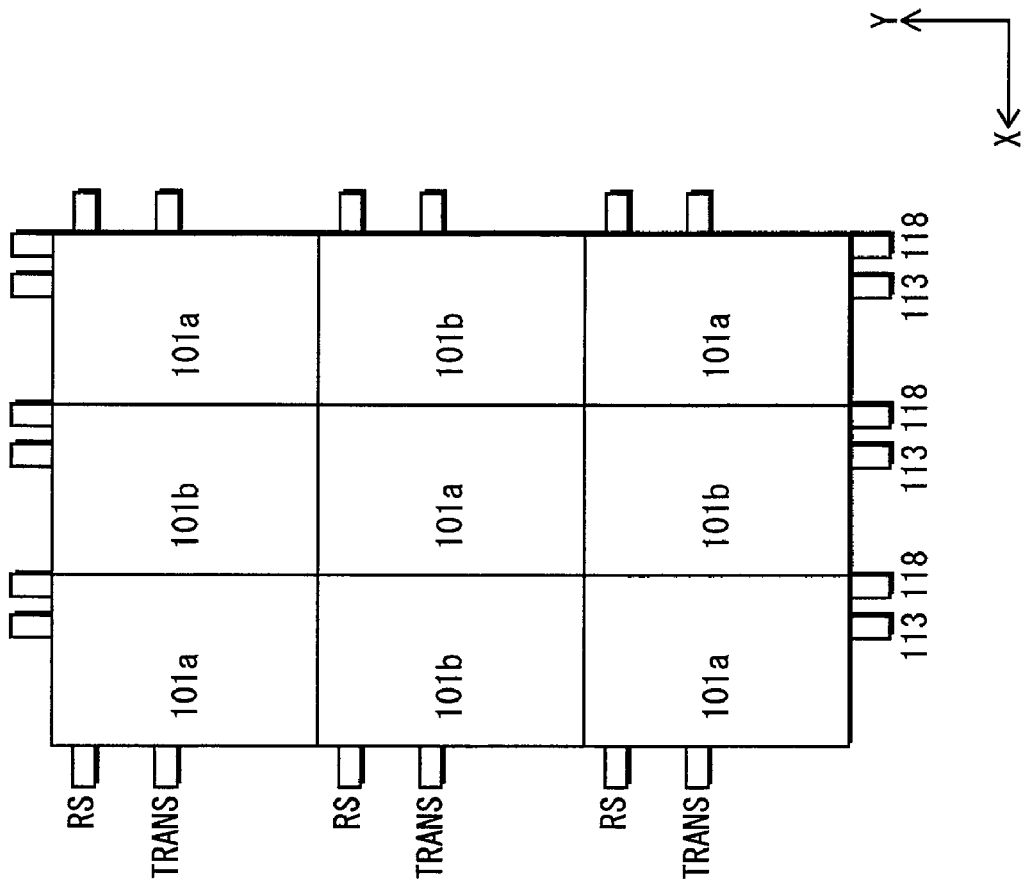

SOLID STATE IMAGING DEVICE CAPABLE OF PARALLEL READING OF DATA FROM A PLURALITY OF PIXEL CELLS

BACKGROUND OF THE INVENTION (1) Field of the Invention

The present invention relates to a solid state imaging device capable of parallel reading of data from a plurality of pixel cells, and especially to a technique for suppressing occurrences of crosstalk.

(2) Description of the Related Art

Solid state imaging devices have been commonly used as image capturing devices such as digital still cameras. One type of solid state imaging device is a MOS-type solid state imaging device having a sensor unit composed of a plurality of pixel cells arranged two-dimensionally (in an array, for example). In order to provide digital still cameras with additional values, such as continuous shooting capability and video shooting capability, it is desirable to improve MOS-type solid state imaging devices in the data readout rate (i.e., the speed at which data is read) from the sensor unit as much as possible.

Various suggestions have been made to improve MOS-type solid state imaging devices in the data readout rate (see for example, JP Patent application publication No. 2006-295620). The following describes the MOS-type solid state imaging device disclosed in JP Patent application publication No. 2006-295620, with reference to FIG. 1. FIG. 1 shows, out of an array of a plurality of pixel cells, two pixel cells 901a and 901b disposed on the same column.

As shown in FIG. 1, each of the two pixel cells 901a and 901b similarly has the following structure. That is, the pixel cell 901a (901b) includes a photodiode 908a (908b) and three transistors 910a, 911a, and 912a (910b, 911b, and 912b). The photodiode 908a (908b) is connected at one end to the source of the transfer transistor 910a (910b). The drain of the transfer transistor 910a (910b) is connected to the gate of the amplification transistor 911a (911b) and also to the source of the reset transistor 912a (912b). The pixel cell 901a (901b) also includes a charge storage portion 909a (909b) disposed between the drain of the transfer transistor 910a (910b) and the gate of the amplification transistor 911a (911b). The gate of the transfer transistor 910a (910b) is connected to a corresponding one of transfer control signal lines Trans all extending in the direction of the X axis shown in the figure (hereinafter, simply "X direction"), whereas the gate of the reset transistor 912a (912b) is connected to a corresponding one of reset signal lines RS all extending in the X direction.

In addition, the drains of the amplification transistors 911a and 911b and of the reset transistors 912a and 912b are commonly connected to a corresponding one of pixel selecting lines 913 all extending in the Y direction. The source of the amplification transistor 911a included in the pixel cell 901a is connected to a corresponding one of output signal lines 904a all extending in the Y direction.

On the other hand, the source of the amplification transistor 911b included in the pixel cell 901b is connected to a corresponding one of output signal lines 904b all extending in parallel to the output signal line 904a.

With reference to FIG. 2, the following now describes a method for driving a conventional MOS-type solid state imaging device having the above structure.

As shown in FIG. 2, in the initial stage of the driving, the pixel selecting line 913 is in the OFF state, the charge storage portions 909a and 909b in the pixel cells 901a and 901b are at the LOW level, and the amplification transistors 911a and 911b are in the OFF state (the state of the amplification transistors 911a and 911b are not shown in the figure).

Next, the pixel selecting line 913 is switched to the ON state and the reset signal lines RS of the rows targeted for the subsequent data reading are switched to the ON state. As a result of this operation, the charge storage portions 909a and 909b are reset to HIGH.

Next, the transfer control signal lines Trans are switched to the ON state, so that electrons resulting from photoelectric conversion by the photodiodes 908a and 908b are separately transferred to the charge storage portions 909a and 909b, which causes the respective charge storage portions 909a and 909b to change in the potential level. The respective amounts of change in the potential level are amplified by the amplification transistors 911a and 911b and then output to the output signal lines 904a and 904b, respectively.

In the above manner, two rows on the same column are selected concurrently and data is read from the two pixel cells 901a and 901b concurrently. With the above-described structure and driving method, the MOS-type solid state imaging device disclosed by the JP patent application publication No. 2006-295620 achieves to increase the data readout rate.

However, the conventional MOS-type solid state imaging device described above involves the following problem. That is, at the time of concurrent reading of data from the two pixel cells 901a and 901b, undesirable coupling occurs between the charge storage portion 909a of the pixel cell 901a and the output signal line 904b as well as between the charge storage portion 909b of the pixel cell 901b and the output signal line 904a, which causes crosstalk. A specific description is given below with reference to FIGS. 1 and 2.

As shown in FIG. 2, in response to that the transfer control signal line Trans is switched to the ON state, electric charge is transferred, so that the potential level of the charge storage portion 909a changes, which in turn changes the potential level of the output signal line 904a. Ideally, the potential level of the output signal line 904b connected to the pixel cell 901b remains unchanged unless the photodiode 908b of the pixel cell 901b has received incident light and thus electric charge has been stored.

As shown in FIG. 1, however, the conventional MOS-type solid state imaging device has the output signal line 904a disposed above or in the vicinity of the pixel cell 901b. This positional relation causes a parasitic capacitance 914 between the output signal line 904a and the charge storage portion 909b. Via the parasitic capacitance 914, the change in the potential level of the output signal line 904a is propagated to the charge storage portion 909b and eventually output to the output signal line 904b.

As a result, a signal responsive to the amount of light received by the photodiode 908a of the pixel cell 901a is output to the output signal line 904b of the neighboring pixel cell 901b, even if no light is received by the photodiode 908b of the pixel cell 901b. As described above, the conventional MOS-type solid state imaging device involves the risk of crosstalk caused by the above-described mechanism.

SUMMARY OF THE INVENTION

The present invention is made in view of the above problems and aims to provide a solid state imaging device that reads data from a plurality of pixel cells in parallel on a column-by-column basis, thereby increasing the data readout rate while reliably suppressing occurrences of crosstalk.

In order to achieve the above aim, the present invention employs the following structure.

A solid state imaging device according to the present invention has a pixel region in which a plurality of pixel cells are disposed in a matrix. Each pixel cell has a photodiode operable to perform photo electric conversion and a charge storage portion operable to store a signal charge generated by the photodiode.

The pixel cells include a first pixel cell and a second pixel cell that are adjacent to each other on a same column. The solid state imaging device further has a first output signal line and a second output signal line disposed in parallel to each other and adjacent to both the charge storage portions of the first and second pixel cells. A signal voltage indicative of a signal charge stored in the charge storage portion of the first pixel cell is output to the first output signal line. A signal voltage indicative of a signal charge stored in the charge storage portion of the second pixel cell is output to the second output signal line.

The output to the first output signal line is made in parallel with the output to the second output signal line. The solid state imaging device further has a conductive layer disposed between the charge storage portion of the first pixel cell and the second output signal line to suppress capacitive coupling therebetween.

In the solid state imaging device according to the present invention described above, the first and second pixel cells adjacent on the same column are provided with the first and second output signal lines, respectively. The signal voltage responsive to the signal charge supplied from the first pixel cell is output to the first output signal line, whereas the signal voltage responsive to the signal charge supplied from the second pixel cell is output to the second output signal line. The output to the second output signal line is made temporally in parallel to the output to the first output signal line. By virtue of this structure, the solid state imaging device according to the present invention is capable of parallel readout of signal voltage (data) from the first and second pixel cells, thereby increasing the data readout rate.

Here, it is noted that the solid state imaging device according to the present invention is similar to the conventional solid state imaging device in the following respect. That is, the first and second output signal lines are disposed to extend in parallel to each other and adjacent to the respective charge storage portions of the first and second pixel cells. With this positional relation, the conventional solid state imaging device suffers from the capacitive coupling between the charge storage portion 909a of the pixel cell 901a and the output signal line 904b as well as between the charge storage portion 909b of the pixel cell 901b and the output signal line 904a, which leads to a problem of crosstalk.

In contrast, the solid state imaging device according to the present invention has a conductive layer disposed between the charge storage portion of the first pixel cell and the second output signal line. The conductive layer serves to suppress the capacitive coupling between the charge storage portion and the second output signal line. Thus, the solid state imaging device according to the present invention is capable of suppressing the capacitive coupling at least between the charge storage portion of the first pixel cell and the second output signal line and thus suppressing occurrences of crosstalk.

In the above description, the term "(to output or to read) in parallel" refers to that the time period during which the signal voltage is output to the first output signal line overlaps at least partially with the time period during which the signal voltage is output to the second output signal line. For example, concurrent reading of signal voltages from a plurality of cells falls within the scope.

As described above, the solid state imaging device according to the present invention reads the signal voltages (data) in parallel from the first and second pixel cells that are adjacent on the same column. As a consequence, the present invention achieves to increase the data readout rate, while reliably suppressing occurrences of crosstalk.

Optionally, in the solid state imaging device according to the present invention, the conductive layer may be connected to the first output signal line. In addition, the solid state imaging device may further have a second conductive layer disposed between the charge storage portion of the second pixel cell and the first output signal to suppress capacitive coupling therebetween. The second conductive layer may be connected to the second output signal line.

With the above-described optional structure, the second conductive layer is disposed between the charge storage portion of the second pixel cell and the first output signal line. Similarly to the above-mentioned conductive layer disposed between the charge storage portion of the first pixel cell and the second output signal line, the second conductive layer serves to suppress the capacitive coupling between the charge storage portion of the second pixel cell and the first output signal line. This option of additionally providing the second conductive layer produces the effect of suppressing capacitive coupling between the charge storage portion of the second pixel cell and the first output signal line, in addition to the above effect of suppressing the capacitive coupling between the charge storage portion of the first pixel cell and the second output signal line.

BRIEF DESCRIPTION OF THE DRAWINGS

These and the other objects, advantages and features of the invention will be come apparent from the following description thereof taken in conjunction with the accompanying drawings which illustrate a specific embodiment of the invention.

In the drawings:

FIG. 16 is a sectional view of the MOS-type solid state imaging device according to Embodiment 2, taken along a line E-E' in FIG. 14;

FIG. 20A is a view schematically showing an arrangement of the pixel cells 101a and 101b, according to Embodiment 3 of the present invention;

FIG. 20B is a view schematically showing an arrangement of the pixel cells 101a and 101b, according to Embodiment 4 of the present invention;

DESCRIPTION OF THE PREFERRED EMBODIMENT

The following describes preferred embodiments for carrying out the present invention, with reference to the accompanying drawings. It should be appreciated, however, that the specific embodiments and modifications described below are given for the purpose of illustrating the structures of the present invention and effects achieved by the structures. The present invention is not so limited and various other changes and modifications may be made without departing from the spirit and scope of the claimed invention.

Embodiment 1

1. Overall Structure

Figure 1:
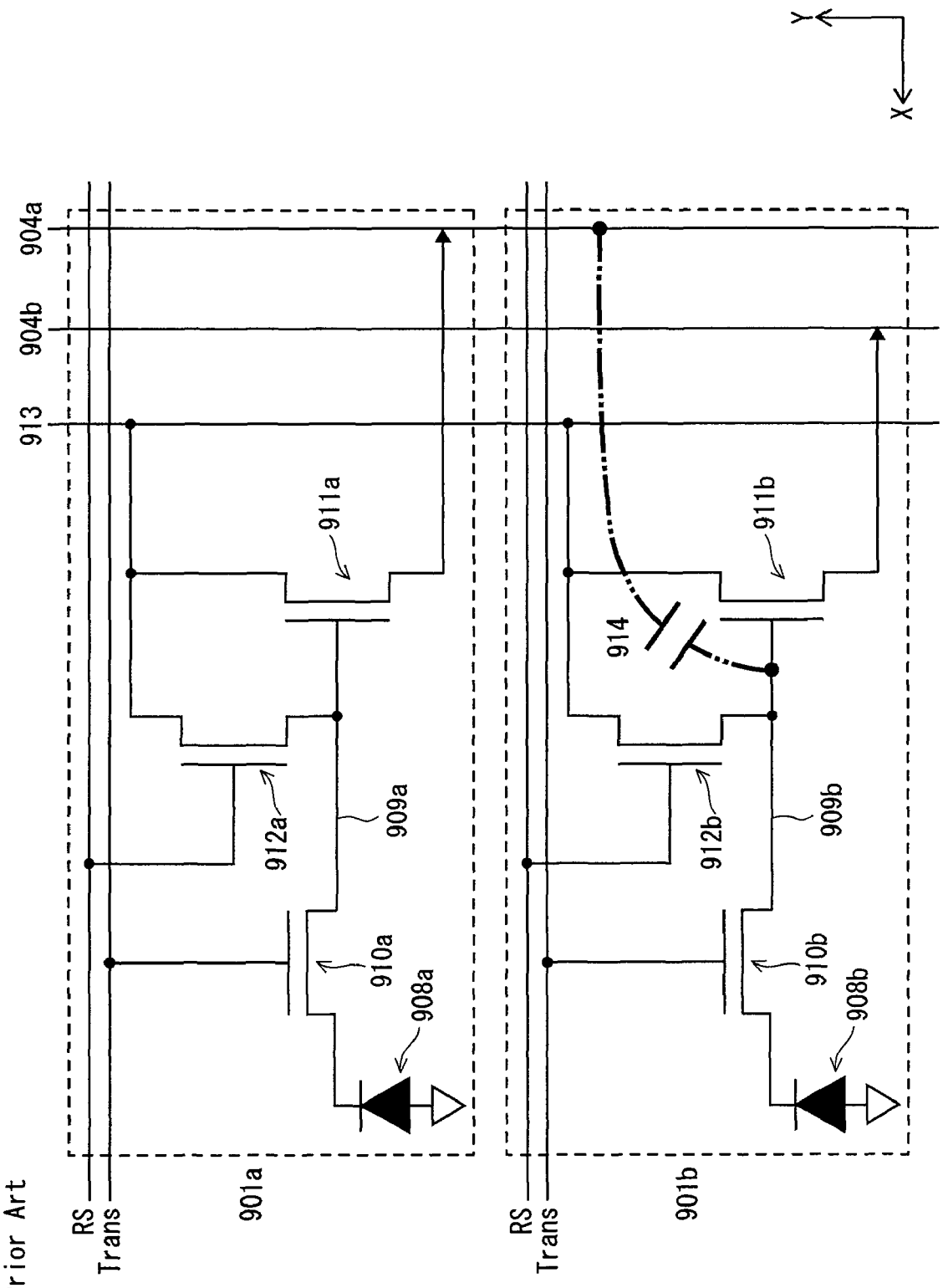
FIG. 1 is a circuit diagram showing pixel cells 901a and 901b of a conventional MOS-type solid state imaging device.
Figure 2:
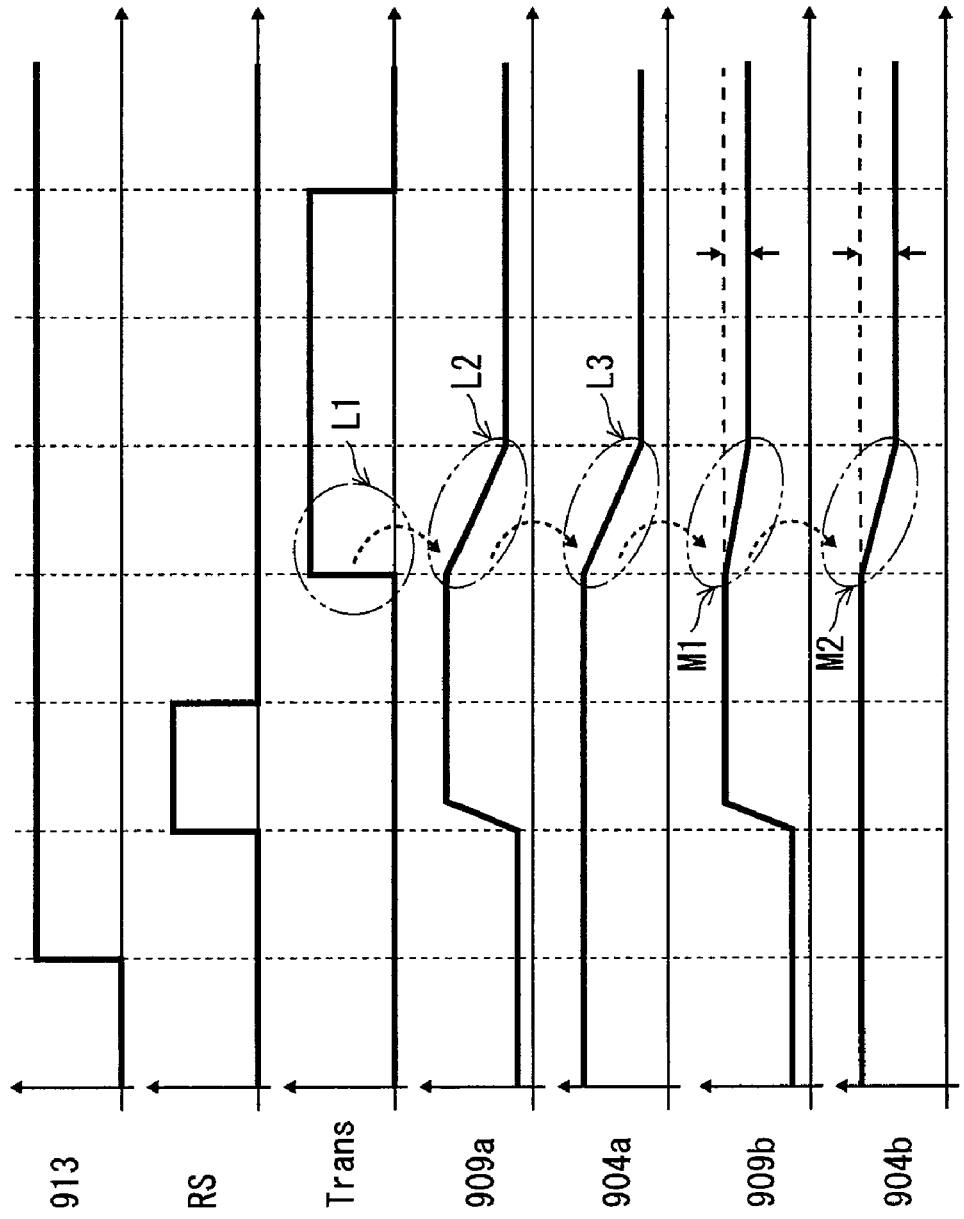
FIG. 2 is a timing chart showing the driving of the conventional MOS-type solid state imaging device.
Figure 3:
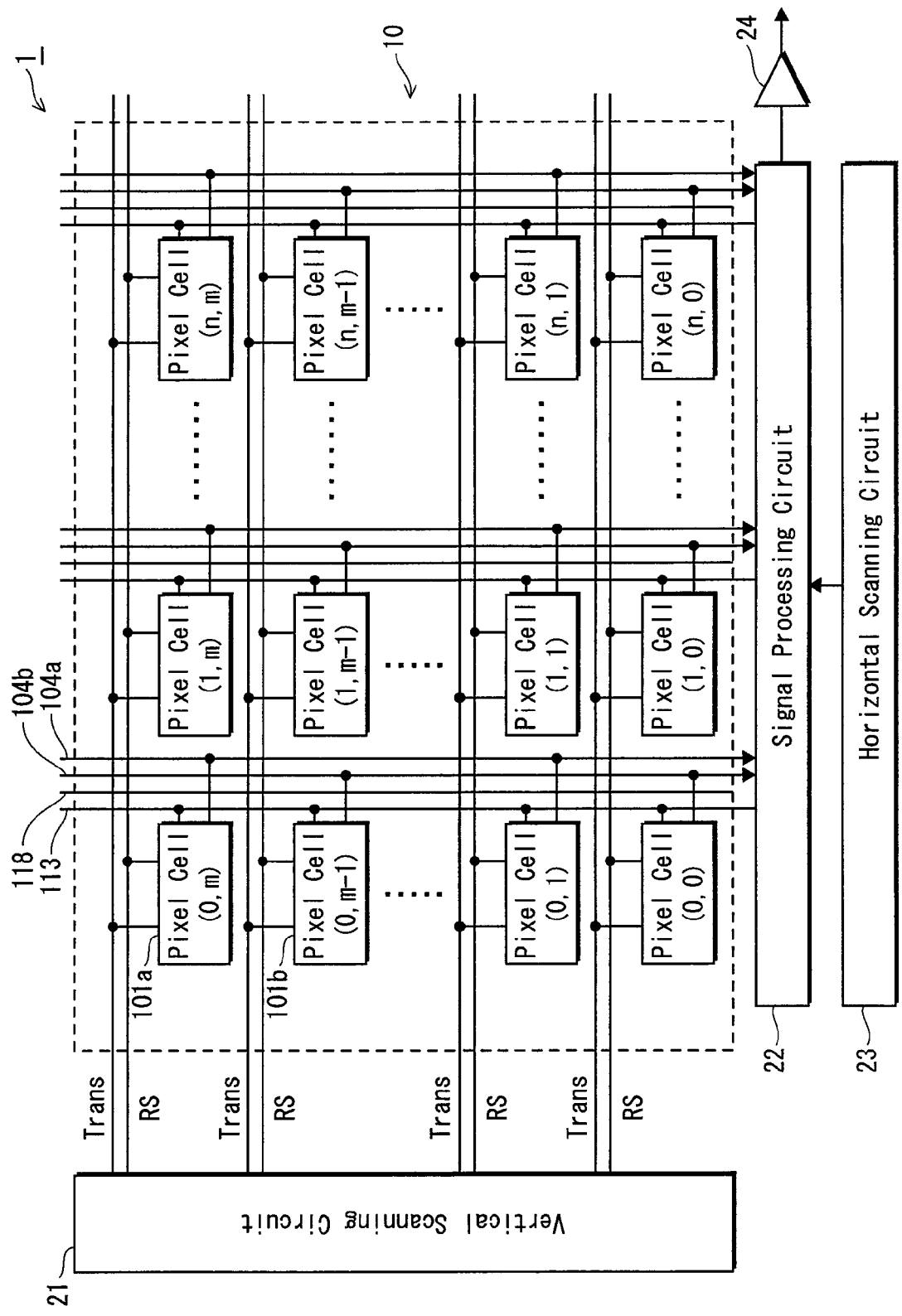
FIG. 3 is a block diagram schematically showing the overall structure of a MOS-type solid state imaging device 1 according to Embodiment 1 of the present invention.

The following describes the overall structure of a solid state imaging device 1 according to Embodiment 1 of the present invention, with reference to FIG. 3.

As shown in FIG. 3, the MOS-type solid state imaging device 1 has a pixel region 10 and a circuit region. The pixel region 10 is composed of a plurality of pixel cells 101a and 101b. The circuit region is composed of various circuits, including a vertical scanning circuit 21, a signal processing circuit 22, a horizontal scanning circuit 23, and an amplifier circuit 24.

In the pixel region 10, the plurality of pixel cells 101a and 101b are arranged in an array, which is one example of a two-dimensional arrangement. The array consists of (n+1) pixel cells per row and (m+1) pixels per column. In the pixel region 10, a transfer control signal line Trans and a reset signal line RS are provided for each row. In addition, a pair of output signal lines 104a and 104b, a pixel selecting line 113, and conductive layers 118 are provided for each column. Each pixel cell 101a is connected to one of the output signal lines 104a, whereas each pixel cell 101b is connected to one of the output signal lines 104b. A more detailed description of the conductive layers 118 will be given below.

A transfer control signal for selecting the pixel cells 101a and 101b in the vertical direction is sequentially supplied to the pixel cells 101a and 101b via the respective transfer control signal lines Trans. Similarly, a reset signal is sequentially supplied to the pixel cells 101a and 101b via the respective reset signal lines RS. The transfer control signal lines Trans and the reset signal lines RS are all connected to the vertical scanning circuit 21.

A pixel select signal is supplied with a predetermined timing to the respective pixel cells 101a and 101b via the pixel selecting lines 113, which are provided one for each column. Upon receipt of the pixel select signal, the pixel cells 101a and 101b output data to the output signal line 104a and 104b. More specifically, the data from each pixel cell 101a is output to a corresponding one of the output signal lines 104a, whereas data from each pixel cell 101b is output to a corresponding one of the output signal lines 104b.

2. Structure of Pixel Cells 101a and 101b

Figure 4:
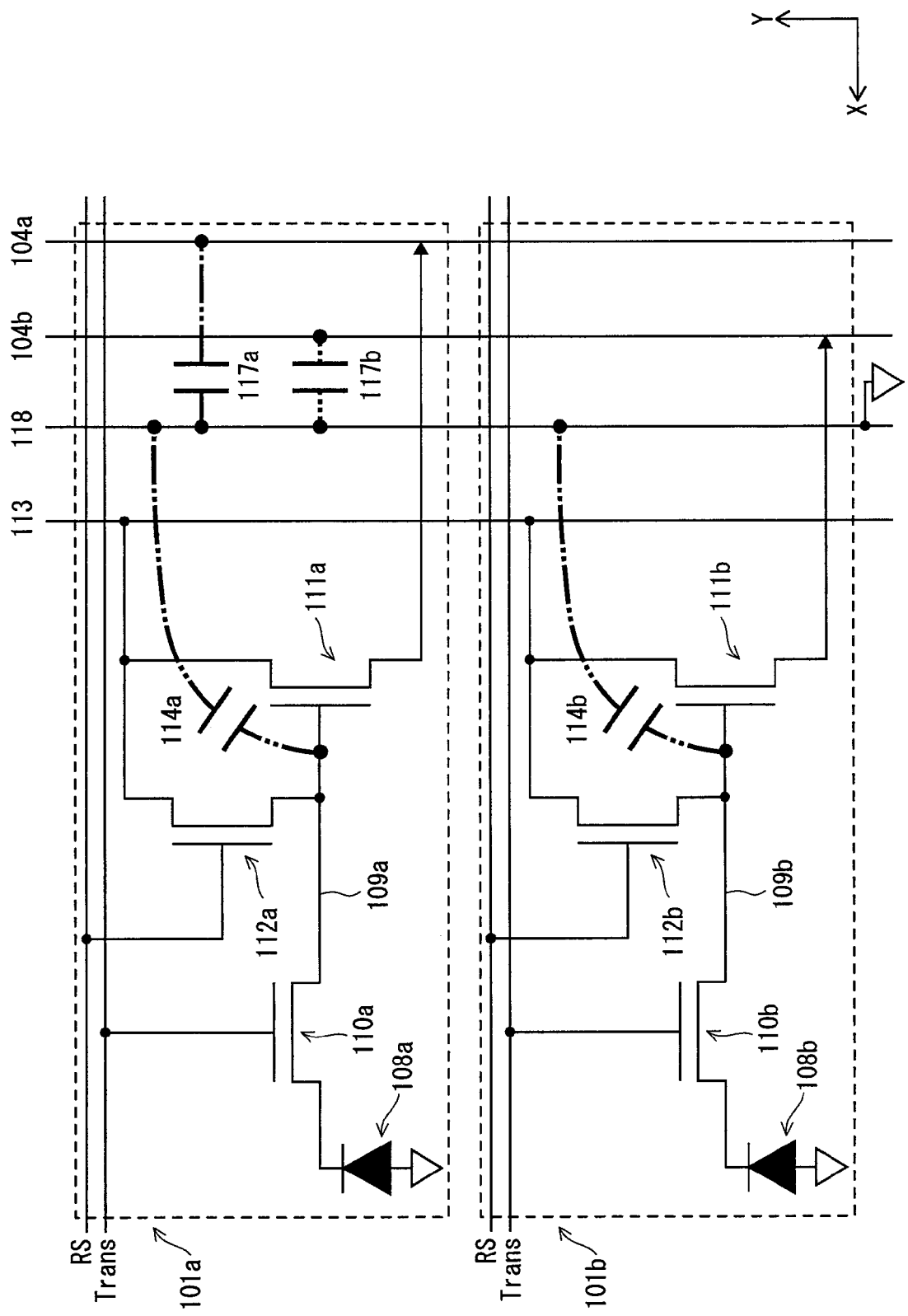
FIG. 4 is a circuit diagram showing pixel cells 101a and 101b of the MOS-type solid state imaging device 1.

The following describes the structure of pixel cells 101a and 101b of the MOS-type solid state imaging device 1 according to Embodiment 1, with reference to FIG. 4. FIG. 4 shows one pair of pixel cells 101a and 101b that are adjacent to each other on the same column.

As shown in FIG. 4, the pixel cell 101a has one photodiode 108a and three transistors (a transfer transistor 110a, an amplification transistor 111a, and a reset transistor 112a) Similarly, the pixel cell 101b has one photodiode 108b and three transistors (a transfer transistor 110b, an amplification transistor 111b, and a reset transistor 112b). Each of the photodiodes 108a and 108b is an element that converts incident light into electric charge indicative of the intensity of the incident light.

Note that the following description relating to the photodiode 108a also applies to the photodiode 108b except for the reference numerals. The photodiode 108a (108b) is connected at one end to the source of the transfer transistor 110a (110b). The drain of the transfer transistor 110a (110b) is connected to the gate of the amplification transistor 111a (111b). On the drain side of the transfer transistor 110a (110b), a charge storage portion 109a (109b) is formed to receive the transferred electric charge.

The charge storage portion 109a (109b) is connected to the source of the reset transistor 112a (112b). The respective drains of the reset transistors 112a and 112b are connected to the pixel selecting line 113, together with the drains of the respective amplification transistors 111a and 111b. The gate of each of the transfer transistors 110a and 110b is connected to a corresponding one of the transfer control signal lines Trans, and each of the reset transistors 112a and 112b is connected to a corresponding one the reset signal lines RS.

As shown in FIG. 4, in the MOS-type solid state imaging device 1, the pixel cell 101a is located above the pixel cell 101b along the Y direction. The source of the amplification transistor 111a in the upper pixel cell 101a is connected to the output signal line 104a. The source of the amplification transistor 111b of the lower pixel cell 101b is connected to the output signal line 104b.

In addition, the MOS-type solid state imaging device 1 according to the Embodiment 1 has the conductive layers 118 interposed between the charge storage portion 109a of the pixel cell 101a and the output signal lines 104b as well as between the charge storage portion 109b of the pixel cell 101b and the output signal line 104a. The conductive layers 108 are grounded and serve to suppress the capacitive coupling between the charge storage portion 109a and the output signal line 104b as well as between the charge storage portion 109b and the output signal line 104a. Note that FIG. 4 shows the location of the conductive layers 118 merely schematically. An exemplary and specific layout of the conductive layers 118 is described below.

3. Layout of Pixel Cells 101a and 101b

The layout of the pair of pixel cells 101a and 101b is described with reference to FIGS. 5-8. Note that FIGS. 5-8 show wiring patterns sequentially from lower to upper layers in the order of lamination.

Figure 5:
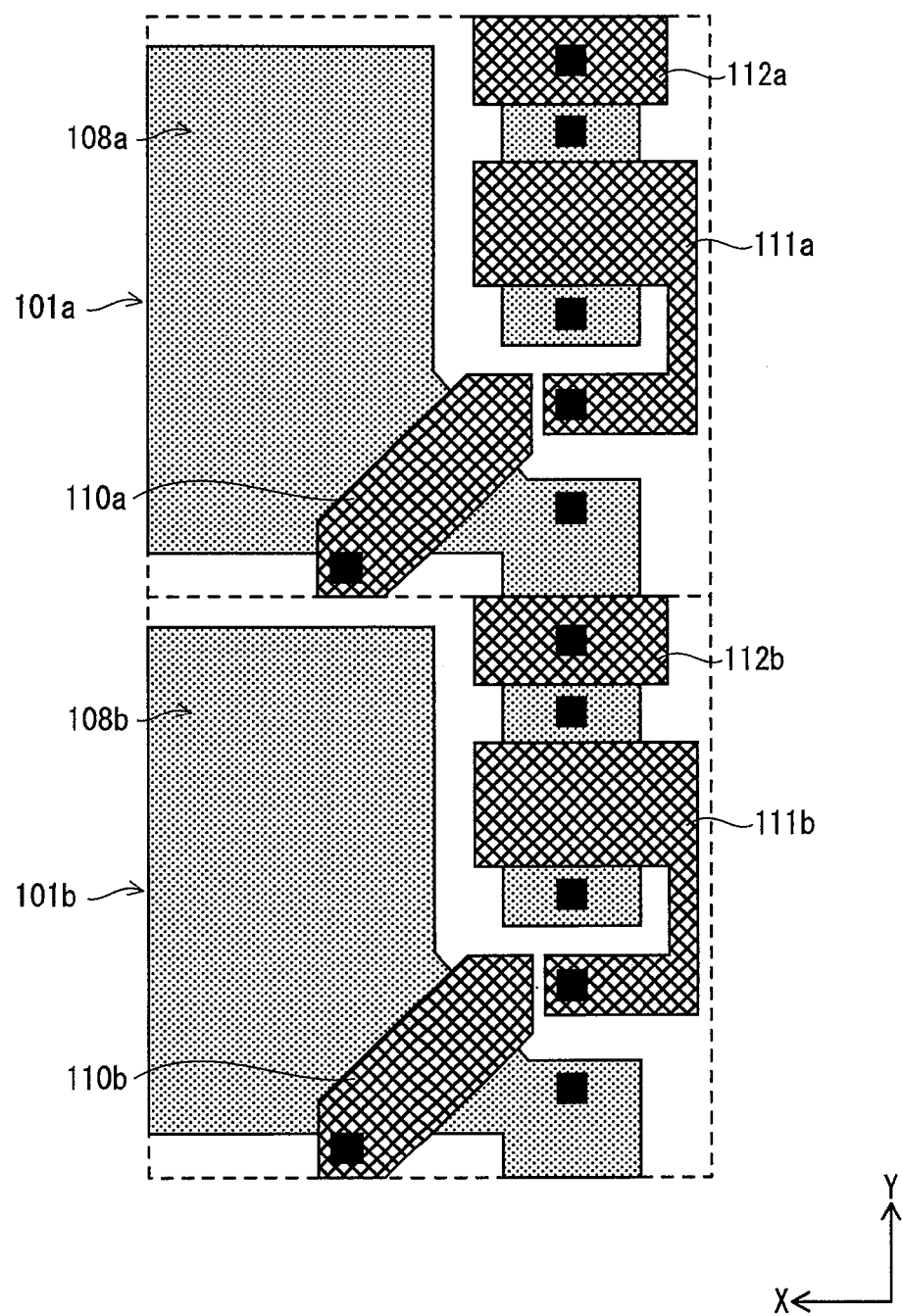
FIG. 5 is a layout drawing showing a part of the pixel cells 101a and 101b of the MOS-type solid state imaging device 1.

As shown in FIG. 5, the pixel cell 101a has the transfer transistor 110a formed above the photodiode 108a so as to extend transversely across a corner portion of the photodiode 108a. The amplification transistor 111a is formed in the vicinity of the transfer transistor 110a, and the reset transistor 112a is formed in the vicinity of the transfer transistor 111a.

The pixel cell 101b is identical in structure with the pixel cell 101a and thus the following description relating to the pixel cell 101a also applies to the pixel cell 101b except for the reference numerals.

Figure 6:
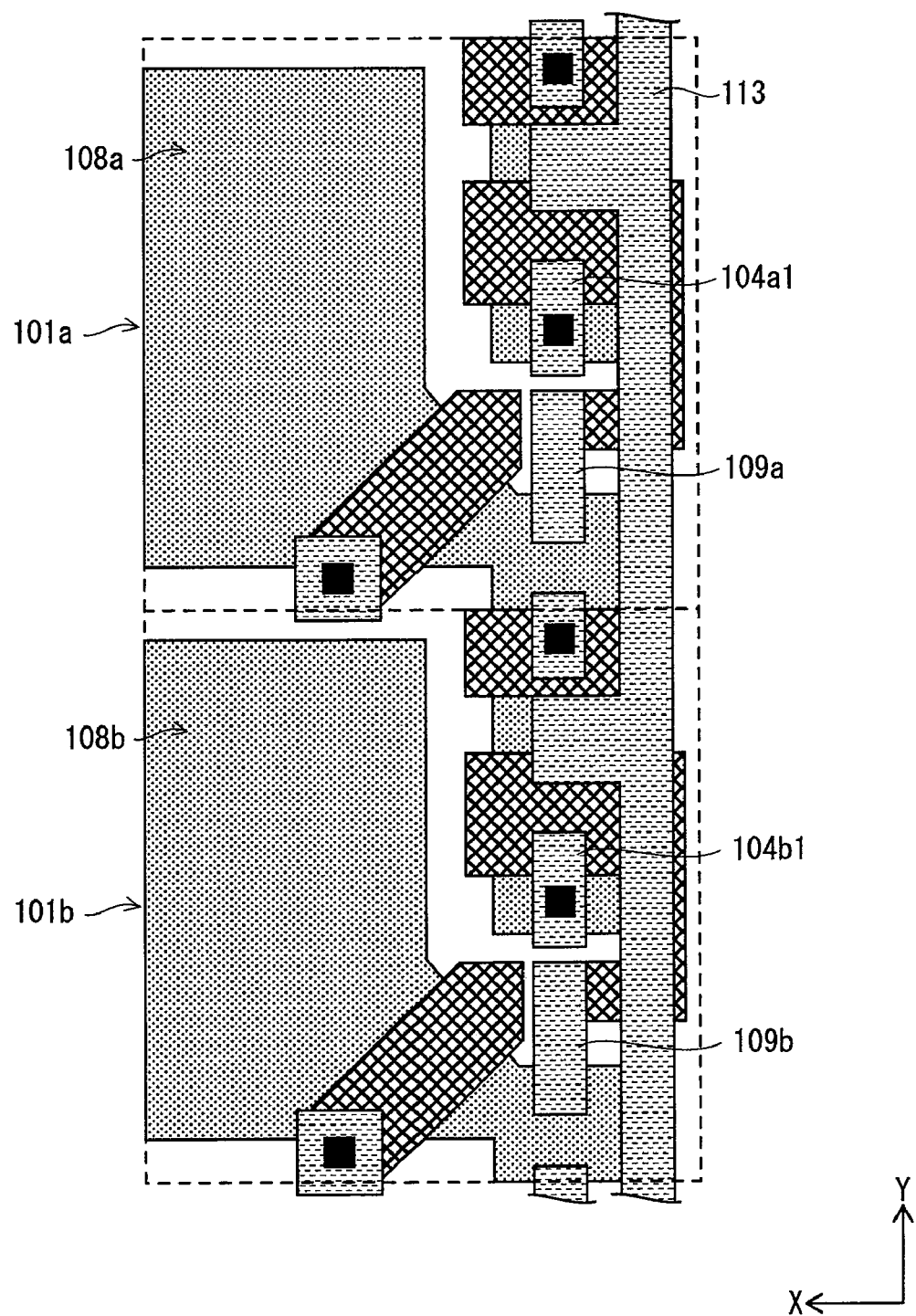
FIG. 6 is a layout drawing showing another part of the pixel cells 101a and 101b of the MOS-type solid state imaging device 1.

As shown in FIG. 6, the pixel cell 101a (101b) has a first layer 104a1 (104b1) of the output signal line 104a (104b) and the charge storage portion 109a (109b) that are formed in spaced relation to each other and above the amplification transistor 111a. In addition, the pixel selecting line 113 is formed to extend across both the pixel cells 101a and 101b.

Figure 7:
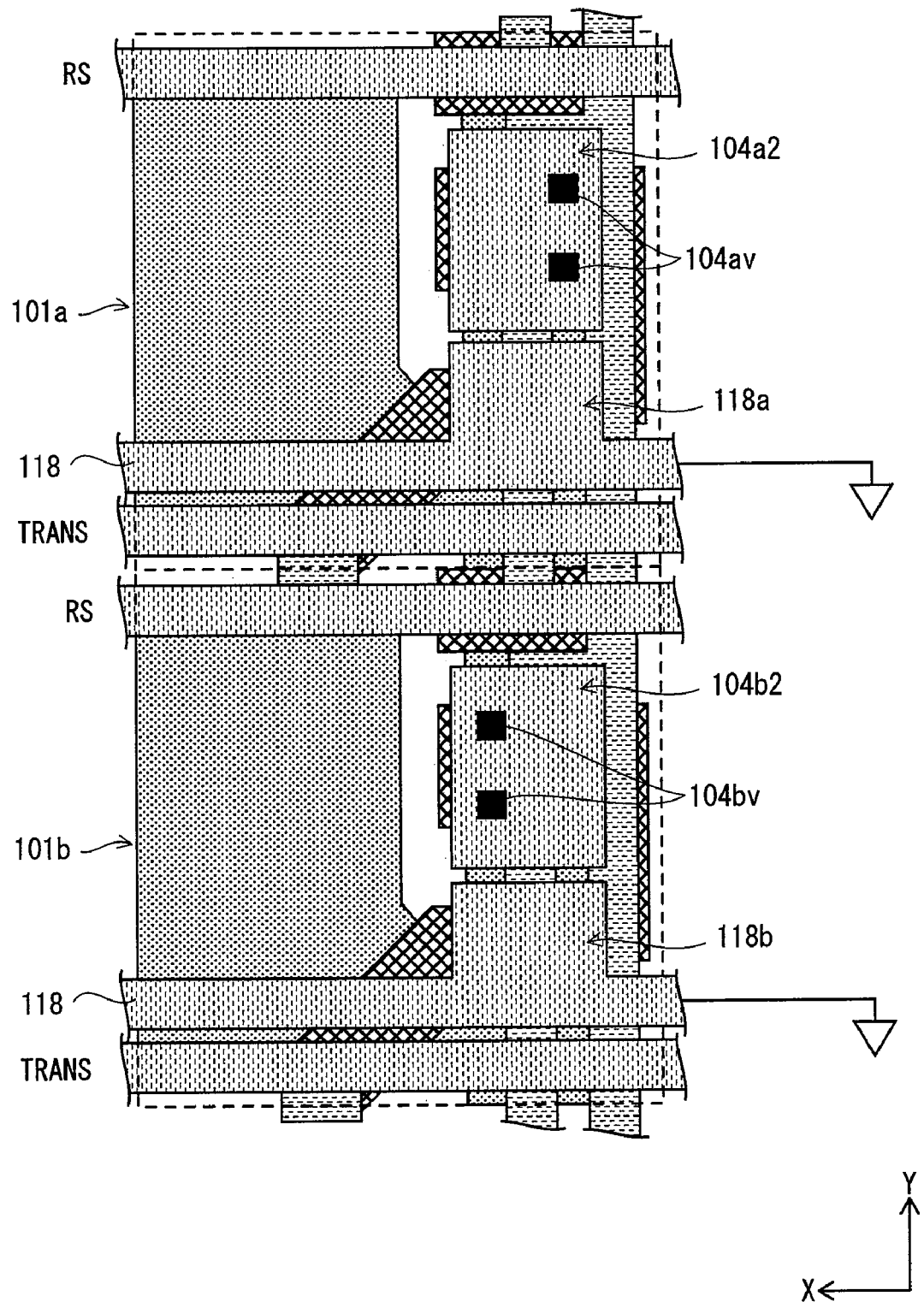
FIG. 7 is a layout drawing showing yet another part of the pixel cells 101a and 101b of the MOS-type solid state imaging device 1.

As shown in FIG. 7, the pixel cell 101a (101b) has a second layer of 104a2 (104b2) of the output signal line 104a (104b) formed above the first layer 104a1 (104b1). Regarding the output signal line 104a (104b), the first layer 104a1 (104b1) shown in FIG. 6 and the second layer 104a2 (104b2) shown in FIG. 7 are connected to each other via contact plugs (See FIG. 6).

Further, also as shown in FIG. 7, the charge storage portion 109a (109b) is covered by a pad portion 118a (118b) of a corresponding one of the conductive layers 118, each of which is grounded. As shown in FIG. 7, on the second layer 104a2 (104b2) of the output signal line 104a (104b), contact plugs 104av (104bv) are formed for connecting the second layer 104a2 (104b2) with third layer 104a3 (104b3) of the output signal line 104a (104b), which will be described later.

The contact plugs 104av are out of alignment with the contact plugs 104bv, along the X direction shown in FIG. 7.

In addition, the reset signal lines RS and the transfer control signal lines Trans are also disposed as shown in FIG. 7.

Figure 8:
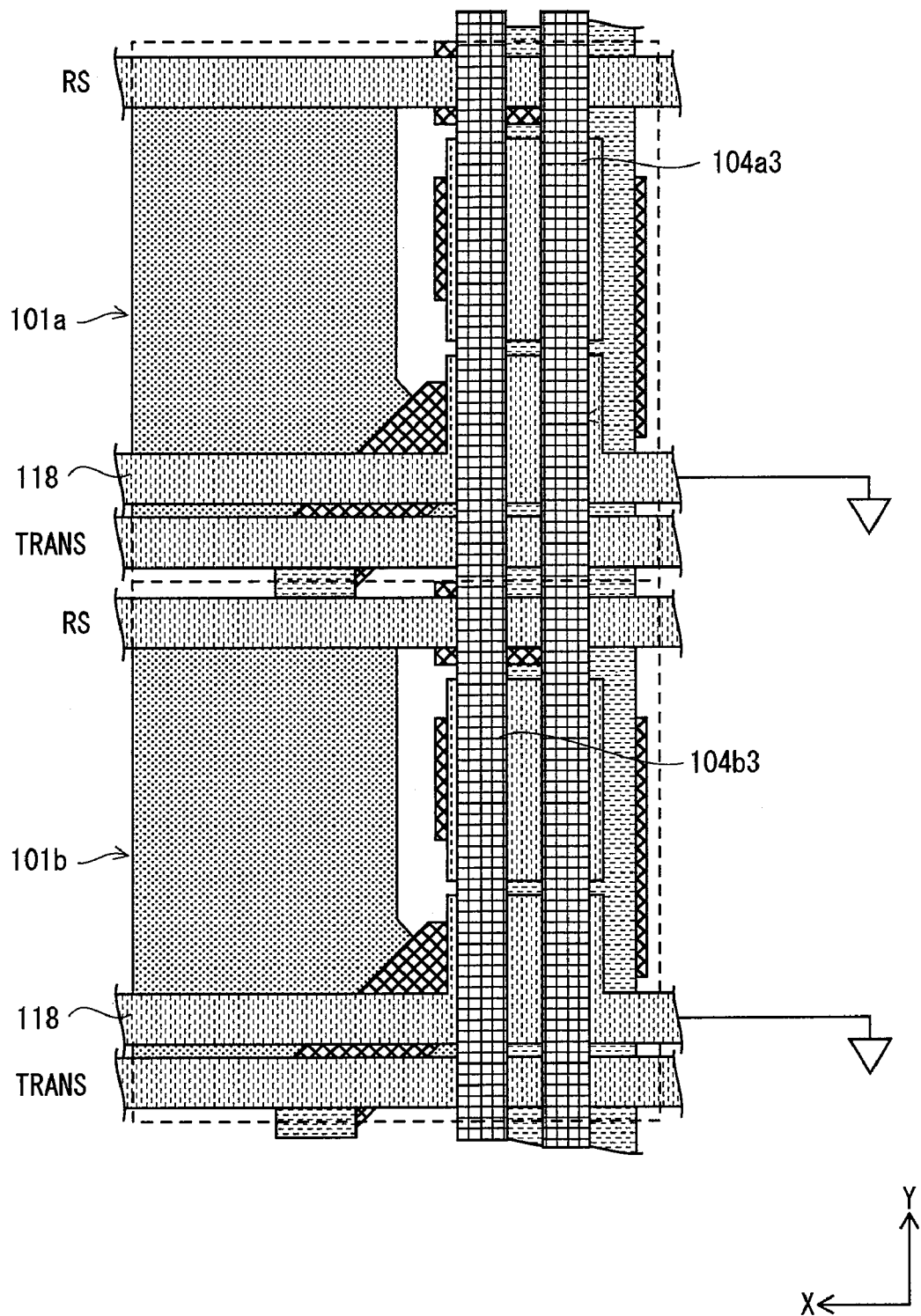
FIG. 8 is a layout drawing showing yet another part of the pixel cells 101a and 101b of the MOS-type solid state imaging device 1.

As shown in FIG. 8, the third layers 104a3 and 104b3 of the respective output signal lines 104a and 104b are disposed to extend in the Y direction and in spaced parallel relation to each other. The second and third layers 104a2 and 104a3 of the output signal line 104a are connected to each other via the contact plugs 104av shown in FIG. 7. Similarly, the second and third layers 104b2 and 104b3 of the output signal line 104b are connected to each other via the contact plugs 104bv shown in FIG. 7.

4. Driving of MOS-Type Solid State Imaging Device 1

Figure 9:
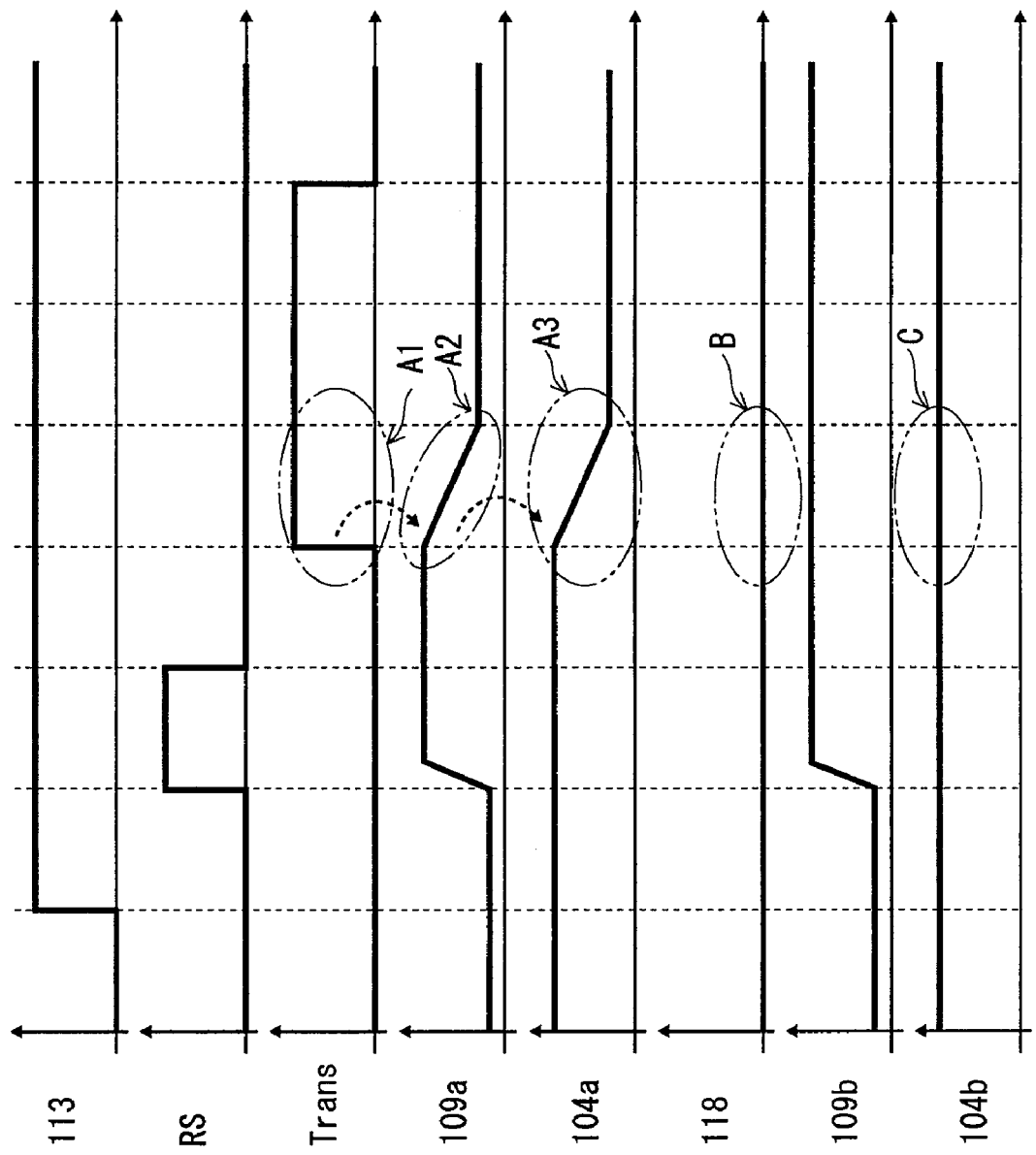
FIG. 9 is a timing chart showing the driving of the MOS-type solid state imaging device 1.

The following describes the driving of the MOS-type solid state imaging device 1, with reference to FIG. 9.

As shown in FIG. 9, at the initial stage of driving the MOS-type solid state imaging device 1, the pixel selecting lines 113 are in the OFF state, the charge storage portions 109a and 109b of the pixel cells 101a and 101b are at the LOW level, and the amplification transistors 111a and 111b are in the OFF state (the state of the amplification transistors 111a and 111b is not shown in the figure).

Next, a specific one of the pixel selecting lines 113 is switched to the ON state to turn ON the reset signal lines RS of the rows targeted for the subsequent data reading. As a result of this operation, the charge storage portions 109a and 109b are reset to HIGH.

Next, the transfer control signal lines Trans are switched to the ON state, so that electrons resulting from photoelectric conversion are separately transferred to the charge storage portions 109a and 109b, which causes the potential level of the respective charge storage portions 109a and 109b to change. The respective amounts of change in the potential level are amplified by the amplification transistors 111a and 111b and output to the output signal lines 104a and 104b, respectively.

As described above, the MOS-type solid state imaging device 1 according to Embodiment 1 has the conductive layers 118 (pad portions 118a and 118b) interposed between the charge storage portion 109a and the output signal line 104b as well as between the charge storage portion 109b and the output signal line 104a. In addition, each conductive layer 118 is earthed. With this arrangement, the capacitive coupling between the respective components described above is suppressed. That is, as shown in FIG. 9, in response to that the transfer control signal line Trans is turned ON (part indicated by an arrow A1), the potential levels of the charge storage portion 109a of the pixel cell 101a and of the output signal line 104a changes (part indicated by arrows A2 and A3). Yet, since each conductive layer 118 is grounded, the potential level of the output signal line 104b less susceptible (part indicated by an arrow C).

That is, the MOS-type solid state imaging device 1 according to Embodiment 1 has the conductive layers 118 each of which is grounded, data read from the adjacent pixel cells 101a and 101b has little or no effect on the parasitic capacitance 114a, 114b, 117a, and 117b (See FIG. 4) that are induced between the conductive layer 118 and the charge storage portion 109a, between the conductive layer 118 and the charge storage portion 109b, between the conductive layer 118 and the output signal line 104a, and between the conductive layer 118 and the output signal line 104b. By virtue of this, the MOS-type solid state imaging device 1 is enabled to read data concurrently from the pixel cells 101a and 101b that are adjacent on the same column, thereby to increase the data read-out rate while reliably suppressing occurrences of crosstalk.

<Modification 1>

Figure 10:
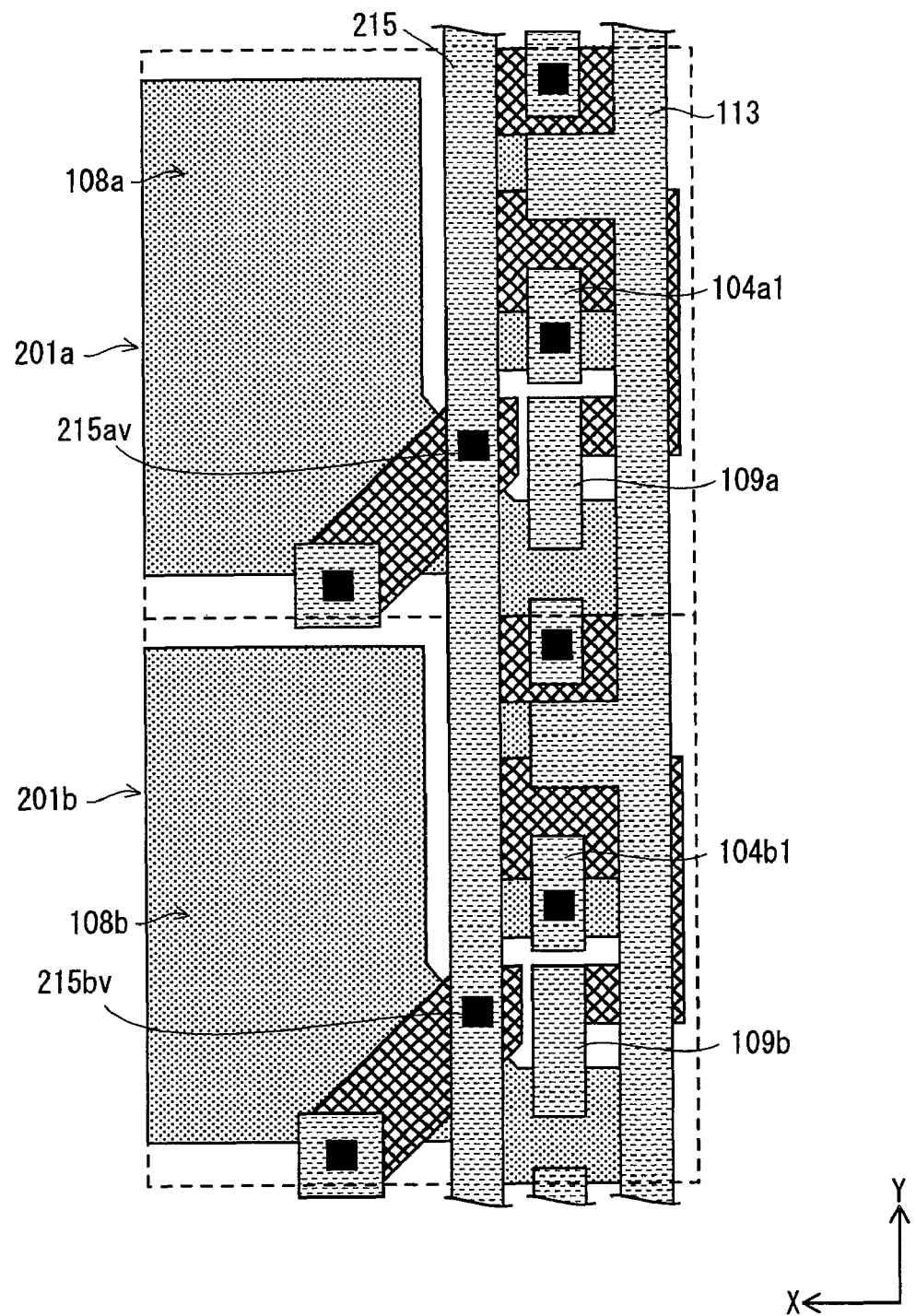
FIG. 10 is a layout drawing showing a part of pixel cells 201a and 201b of a MOS-type solid state imaging device according to Modification 1 of the present invention.
Figure 11:
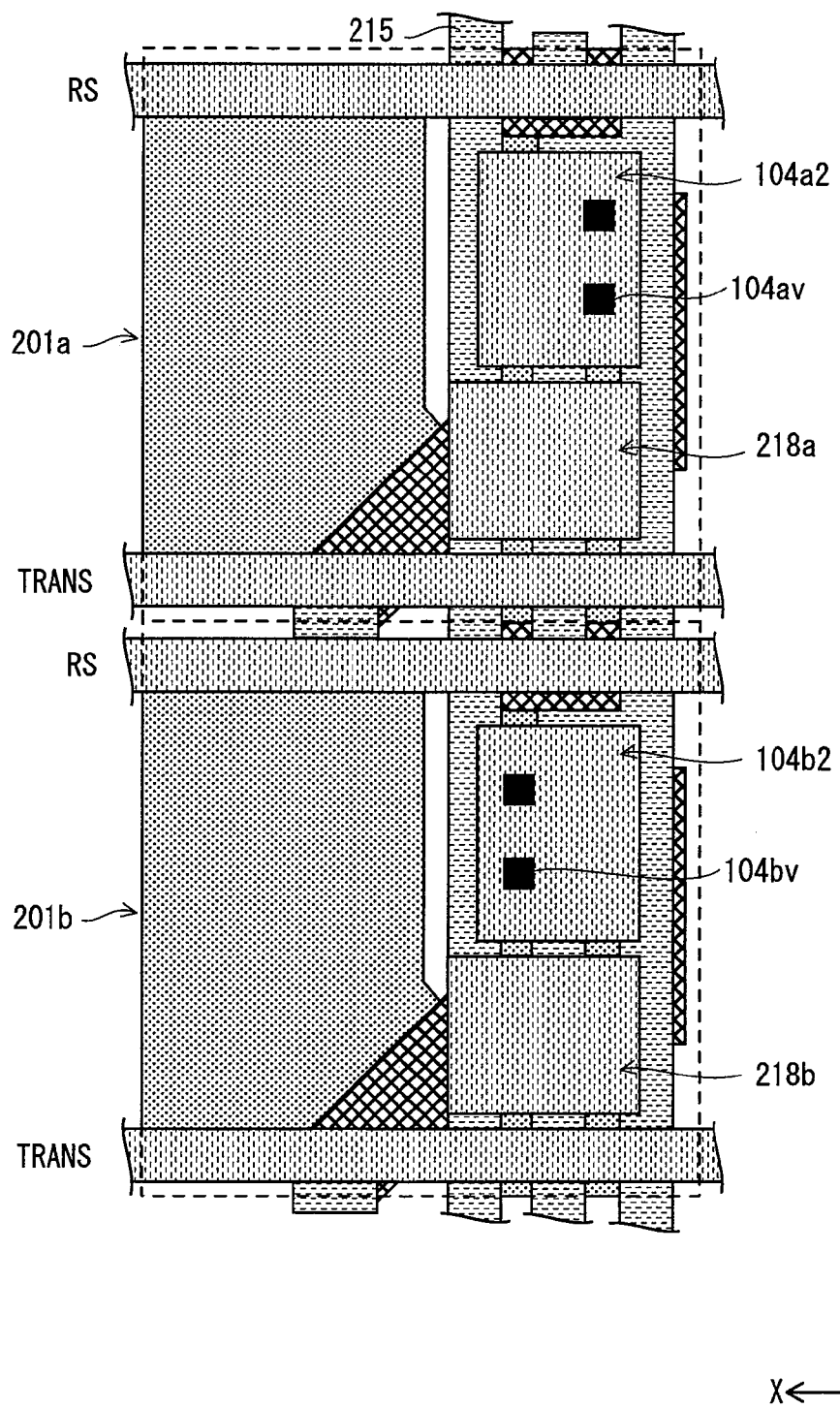
FIG. 11 is a layout drawing showing another part of the pixel cells 201a and 201b of the MOS-type solid state imaging device according to Modification 1.

The following describes the structure of a MOS-type solid state imaging device according to Modification 1, with reference to FIGS. 10 and 11. Note that the Modification 1 according to the MOS-type solid state imaging device is basically identical in structure to the MOS-type solid state imaging device 1 according to Embodiment 1, except for the structure of conductive layers 218a and 218b. Accordingly, the following mainly describes the difference with the MOS-type solid state imaging device 1. Note that the layout of Embodiment 1 shown in FIG. 5 is commonly applicable to Modification 1 and thus no further illustration and description thereof is given here.

As shown in FIG. 10, the MOS-type solid state imaging device according to Modification 1 additionally has dummy lines 215 each disposed to extend in parallel to the pixel selecting lines 113 in a manner that the charge storage portions 109a and 109b as well as the first layers 104a1 and 104b1 of the output signal lines 104a and 104b are sandwiched between the dummy line 215 and the pixel selecting line 113. The dummy lines 215 may be disposed in a similar manner to the conductive layer of the Embodiment 1 but not limited thereto as long as the dummy lines 215 are maintained at the fixed potential level.

Each dummy line 215 has contact plugs 215av and 215bv formed thereon at locations within the pixel cells 201a and 201b, respectively.

Next, as shown in FIG. 11, a second layer 104a2 is formed above the first layer 104a1 of the output signal line 104a. Similarly, a second layer 104b2 is formed above the first layer 104b1 of the output signal line 104b. On the second layers 104a2 and 104b2 of the output signal lines 104a and 104b, contact plugs 104av and 104bv are formed, respectively.

In addition, the conductive layers 218a and 218b are disposed to cover, from above, the charge storage portions 109a and 109b, respectively. The conductive layers 218a and 218b cover part of the dummy line 215 and are in contact with the dummy line 215 via the contact plugs 215av and 215bv.

Similarly to the MOS-type solid state imaging device 1 according to Embodiment 1, the MOS-type solid state imaging device according to Modification 1 having the above structure is ensured to increase the data read-out rate and to reliably suppress occurrences of crosstalk.

Embodiment 2

The following describes the structure of a MOS-type solid state imaging device according to Embodiment 2, with reference to FIGS. 12-18.
1. Layout of Pixel Cells 301a and 301b The following describes the layout of pixel cells 301a and 301b of the MOS-type solid state imaging device according to Embodiment 2, with reference to FIGS. 12-14.

Since the layout of Embodiment 1 shown in FIG. 5 is commonly applicable to the MOS-type solid state imaging device according to Embodiment 2, no further illustration and description thereof is given here.

Figure 12:
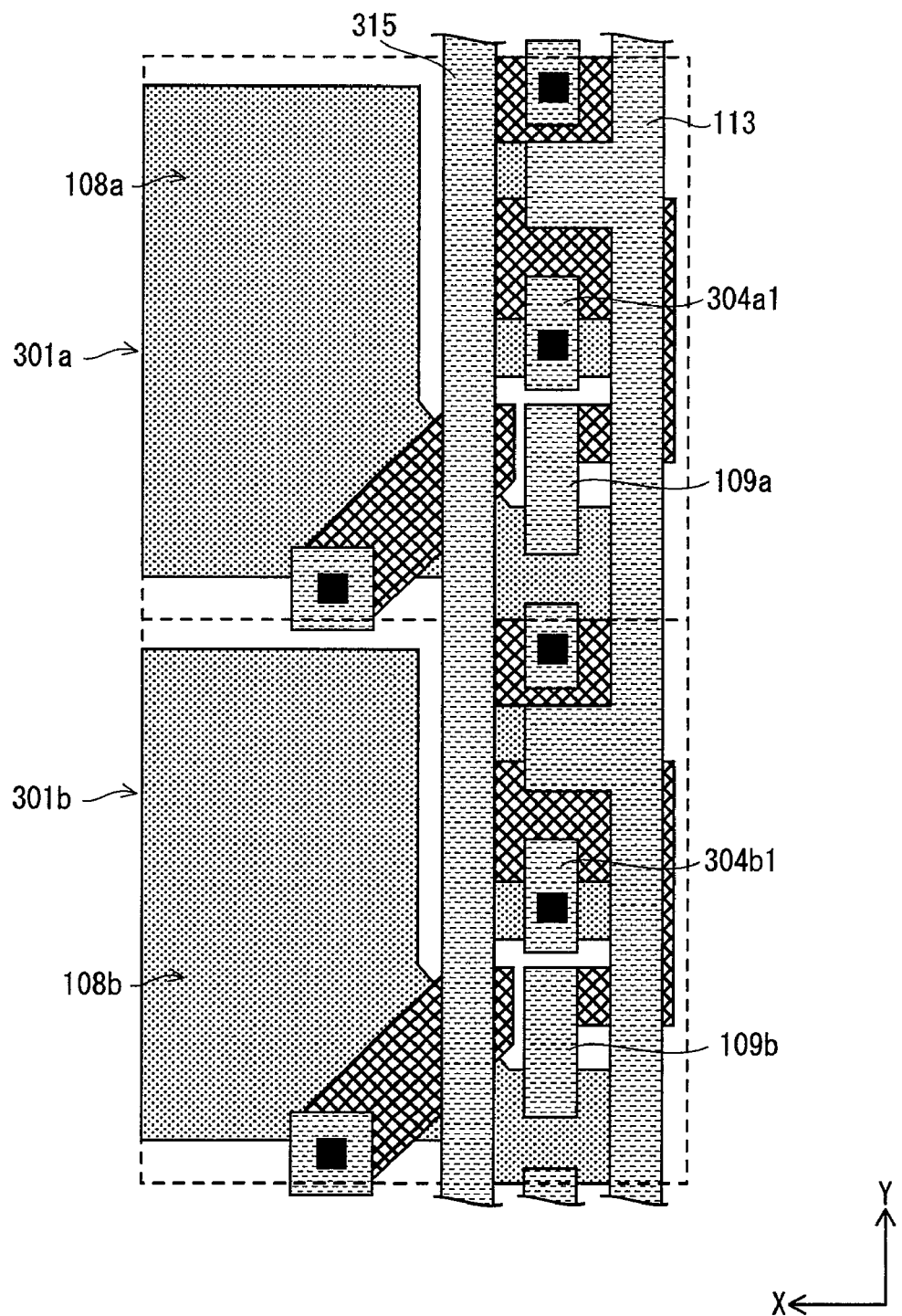
FIG. 12 is a layout drawing showing a part of pixel cells 301a and 301b of a MOS-type solid state imaging device according to Embodiment 2 of the present invention.

Similarly to the MOS-type solid state imaging device according to Modification 1 (see FIG. 10) and as shown in FIG. 12, the MOS-type solid state imaging device according to Embodiment 2 has dummy lines 315 each disposed to extend in the Y direction in parallel to the pixel selecting lines 113 in a manner that first layers 304a1 and 304b1 of the output signal lines as well as the charge storage portions 109a and 109b are sandwiched between the dummy line 315 and the pixel selecting line 113. However, the MOS-type solid state imaging device according to Embodiment 2 has no contact plugs disposed on the dummy line 315.

Figure 13:
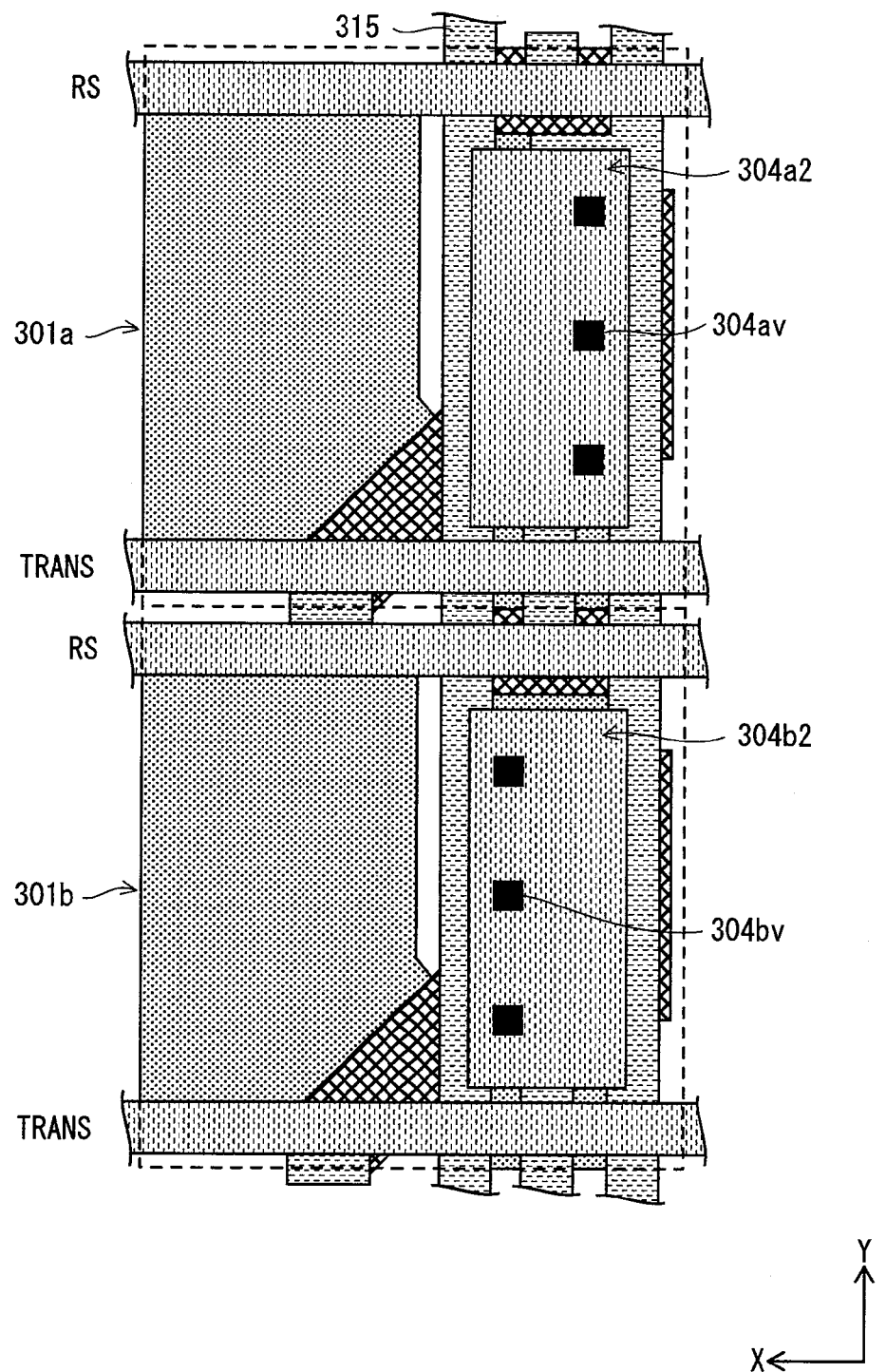
FIG. 13 is a layout drawing showing another part of the pixel cells 301a and 301b of the MOS-type solid state imaging device according to Embodiment 2.

As shown in FIG. 13, a second layer 304a2 of the output signal line is disposed to cover the first layer 301a1 of the output signal line and also cover the charge storage portion 109a. Similarly, a second layer 304b2 of the output signal line is disposed to cover the first layer 301b1 of the output signal line and also cover the charge storage portion 109b. The second layers 304a2 and 304b2 of the respective output signal lines are not connected to the dummy line 315 and have contact plugs 304av and 304bv disposed thereon to extend in the upward direction.

Figure 14:
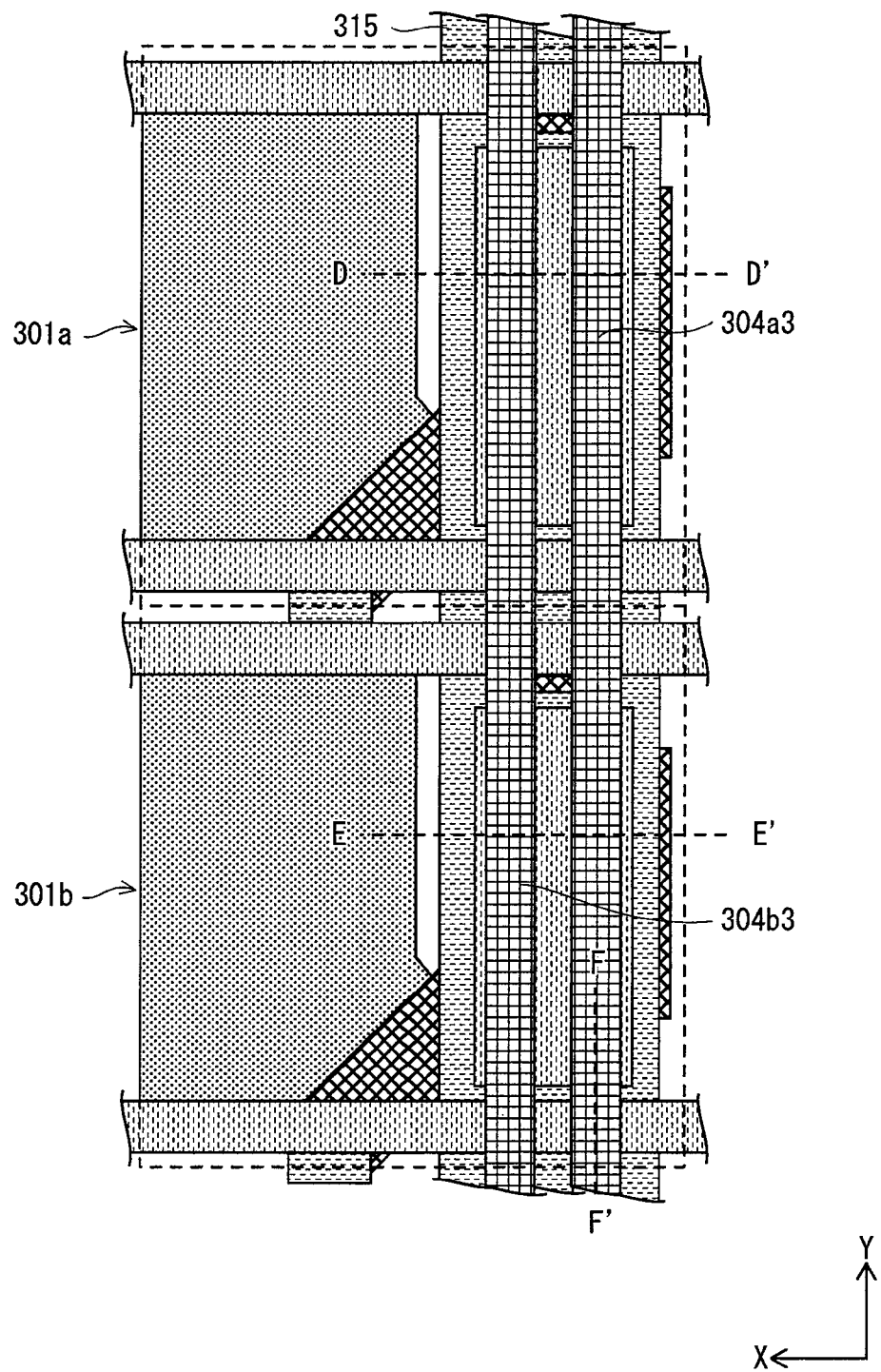
FIG. 14 is a layout drawing showing yet another part of the pixel cells 301a and 301b of the MOS-type solid state imaging device according to Embodiment 2.
Figure 15:
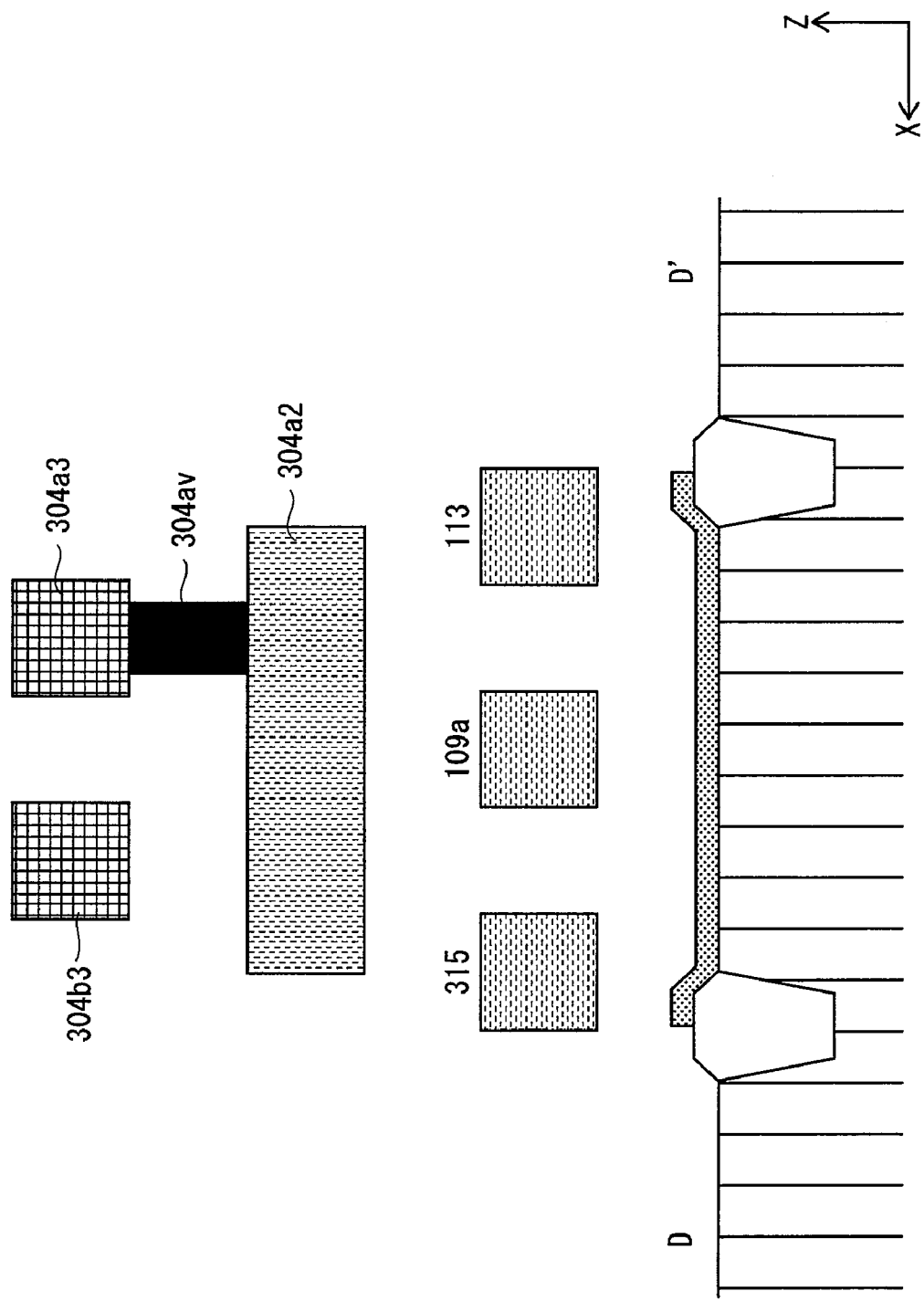
FIG. 15 is a sectional view of the MOS-type solid state imaging device according to Embodiment 2, taken along a line D-D' in FIG. 14.
Figure 17:
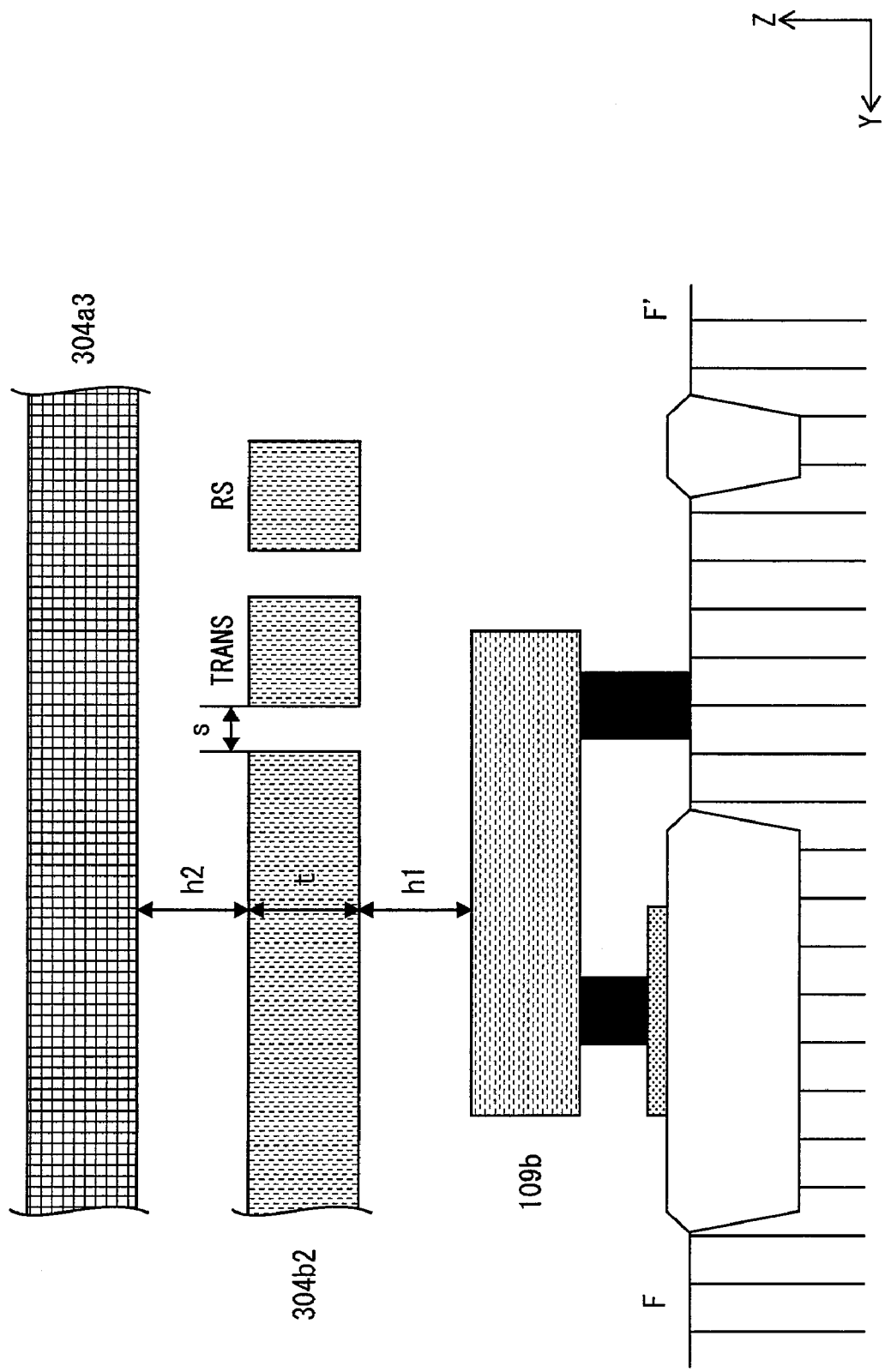
FIG. 17 is a sectional view of the MOS-type solid state imaging device according to Embodiment 2, taken along a line F-F' in FIG. 14.

Next, as shown in FIG. 14, third layers 304a3 and 304b3 of the respective output signal lines are disposed to extend in the Y direction and in parallel relation to each other. The second and third layers 304a2 and 304a3 of the output signal line are connected to each other via the contact plug 304av. Similarly, the second and third layers 304b2 and 304b3 of the output signal line are connected to each other via the contact plug 304bv.
2. Cross-Sectional Structure of Pixel Cells 301a and 301b The following describes the cross-sectional structure of the pixel cells 301a and 301b included in the MOS-type solid state imaging device according to Embodiment 2, with reference to FIGS. 15-17. FIG. 15 shows a cross-sectional view of the pixel cells 301a and 301b, taken along a line D-D' shown in FIG. 14. FIG. 16 shows a cross-sectional view of the pixel cells 301a and 301b, taken along a line E-E' shown in FIG. 14. FIG. 17 shows a cross-sectional view of the pixel cells 301a and 301b, taken along a line F-F' shown in FIG. 14.

As shown in FIG. 15, the charge storage portion 109a of the pixel cell 301a is disposed between the pixel selecting line 113 and the dummy line 315 along the X direction. The second layer 304a2 of the output signal line is disposed above the charge storage portion 109a in the Z direction. The second and third layers 304a2 and 304a3 of the output signal line are connected to each other via the contact plug 304av. With this structure, the charge storage portion 109a of the pixel cell 301a is isolated by the pixel selecting line 113, the dummy line 315, and the second line 304a2 of the output signal line, from capacitive coupling with the respective layers 304b1, 304b2, and 304b3 of the output signal line 304b connected to the pixel cell 301b.

Similarly, as shown in FIG. 16, the charge storage portion 109b of the pixel cell 301b is disposed between the pixel selecting line 113 and the dummy line 315 in the X direction. The second layer 304b2 of the output signal line is disposed above the charge storage portion 109b in the Z direction. The second and third layers 304b2 and 304b3 of the output signal line is connected to each other via the contact plug 304bv. With this structure, similar to the charge storage portion 109a of the pixel cell 301a,
the charge storage portion 109b is isolated by the pixel selecting line 113, the dummy line 315, and the second layer 304b2 of the output signal line, from capacitive coupling between the respective layers 304a1, 304a2 and 304a3 of the output signal line 301a corresponding to the pixel cell 301a.

A comparison between FIGS. 15 and 16 indicates that the cross sections of the pixel cell 301a taken along the line D-D' and the line E-E' are basically identical with each other, except that the locations of the contact plugs 304av and 304bv are symmetric with respect to an imaginary line parallel to the Z direction. Accordingly, occurrences of crosstalk are reliably suppressed, with a minimum difference in property between the pixel cells 301a and 301b.

In the cross section of the pixel cell 301b taken along the line F-F' shown in FIG. 17, the second layer 304b2 of the output signal line and the transfer control signal line Trans are disposed above the charge storage portion 109b in the Z direction in a manner to partly cover, from above, the charge storage portion 109b. In addition, the output signal line 304a3 connected to the pixel cell 304a is disposed above in the Z direction at a location above the second layer 304b2 of the output signal line, the transfer control signal line Trans, and the reset signal line RS.

The MOS-type solid state imaging device according to Embodiment 2 satisfies the positional relation as defined by the following Expression 1. That is, the spacing s between the second layer 304b2 of the output signal line and the transfer control signal line Trans in the Y direction is set to be smaller than the thickness t of the second layer 304b2 of the output signal line.

$$s < t \qquad \text{[Expression 1]}$$

In addition, the positional relation as defined by the following Expression 2 is satisfied. That is, the distance h1 between the charge storage portion 109b and the second layer 304b2 of the output signal line in the Z direction set to be smaller than the distance h2 between the second layer 304b2 of the output signal line and the third layer 304a3 of the output signal line in the Z direction.

$$h1 < h2 \qquad \text{[Expression 2]}$$

With the above settings, the MOS-type solid state imaging device according to Embodiment 2 more reliably suppresses parasitic capacitance between the third layer 304a3 of output signal line connected to the pixel cell 301a and the charge storage portion 109b of the pixel cell 301b, and thus suppressing occurrences of crosstalk more effectively.

3. Driving of MOS-Type Solid State Imaging Device According to Embodiment 2

Figure 18:
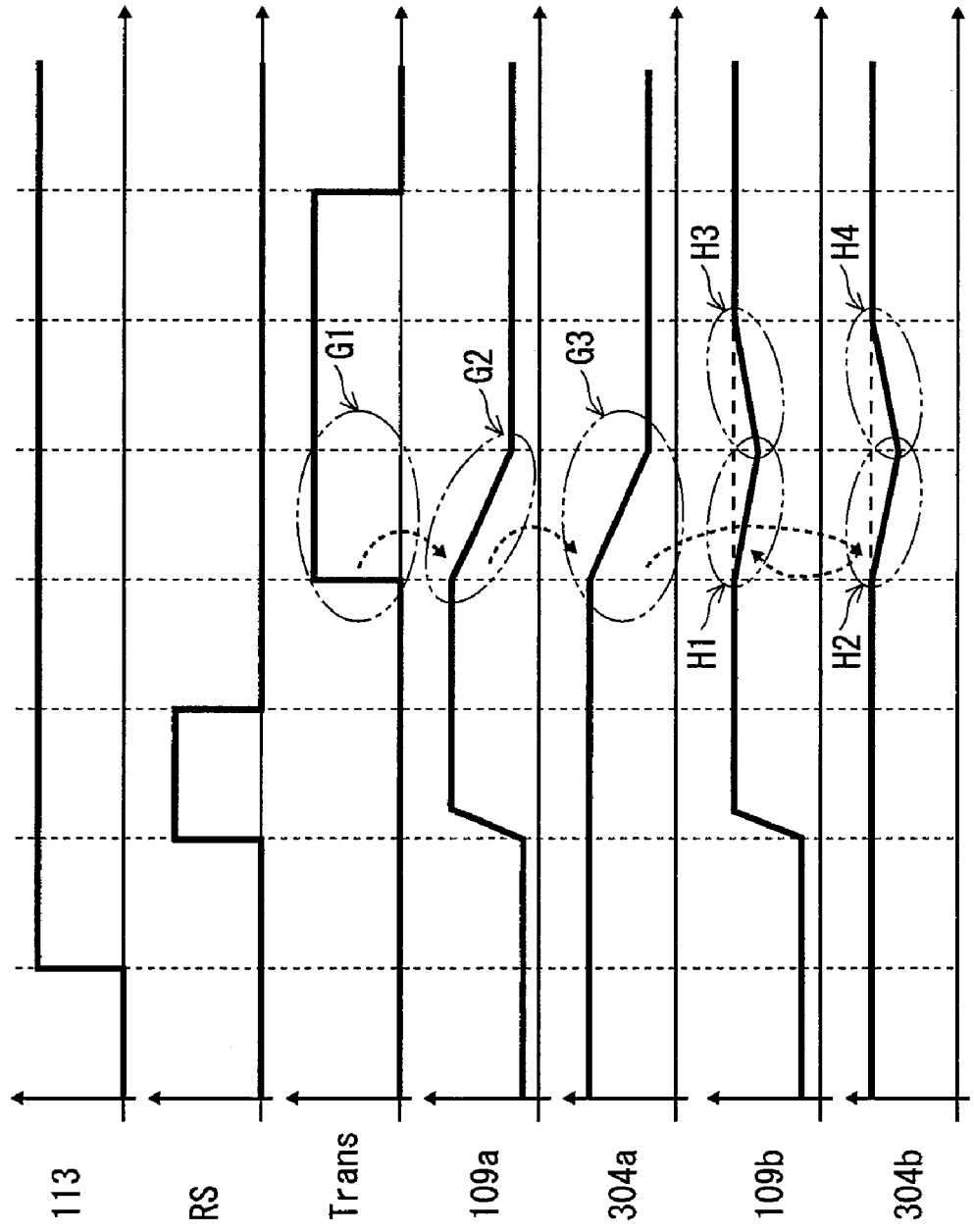
FIG. 18 is a timing chart showing the driving of the MOS-type solid state imaging device according to Embodiment 2.

The following describes the driving of the MOS-type solid state imaging device according Embodiment 2, with reference to FIG. 18.

The operations up to the selection of the pixel cell 301a and the data output to the output signal line 304a are the same as the corresponding operations described with reference to the MOS-type solid state imaging device 1 according to Embodiment 1.

As described above, in the MOS-type solid state imaging device according to Embodiment 2, the output signal line 304a connected to the pixel cell 301a and the output signal line 304b connected to the pixel cell 301b extend in parallel to each other and thus inevitably interact with each other. For this reason, in response to that the signal carried by the transfer control signal line Trans is brought to ON (part indicated by an arrow G1), the potential level of the charge storage portion 109a of the pixel cell 301a decreases (part indicated by an arrow G2) which in turn causes the potential level of the output signal line 304a to decrease (part indicated by an arrow G3). Due to the effect by parasitic capacitance, the charge storage portion 109b of the pixel cell 301b also decreases in the potential level (part indicated by an arrow H1).

However, the MOS-type solid state imaging device according to Embodiment 2 is provided with a conductive layer acting as the second layer 304b2 of the output signal line disposed to cover the charge storage portion 109b of the pixel cell 301b from above. In response to a decrease in the potential level of the output signal line 304b to some level, the MOS-type solid state imaging device according to Embodiment 2 is driven by the amplification transistor 111b to increase the potential level (part indicated by an arrow H4). With this mechanism, being affected by the parasitic capacitance, the potential level of the charge storage portion 109b of the pixel cell 301b increases (part indicated by an arrow H3), and eventually the output signal line 304b stabilizes at a desired potential level.

As described above, the MOS-type solid state imaging device according to Embodiment 2 is driven in a manner to reliably suppress occurrences of crosstalk.

4. Advantages of MOS-Type Solid State Imaging Device According to Embodiment 2

The MOS-type solid state imaging device according to Embodiment 2 is capable of simultaneously reading data from a plurality of pixel cells (301a and 301b) that are adjacent on the same column, thereby increasing the data readout rate, while reliably suppressing occurrences of crosstalk. With respect to this advantage, Embodiment 2 is similar to Embodiment 1 and Modification 1.

In addition to the above-described advantage, the MOS-type solid state imaging device according to Embodiment 2 is also advantageous in that the difference in property between the pixel cells 301a and 301b is kept to a minimum. This advantage is achieved by the locations of the contact plugs 304av and 304bv as described above and shown in FIGS. 15 and 16. That is, the MOS-type solid state imaging device according to Embodiment 2 has the contact plugs 304av and 304bv disposed in symmetric relation with respect to an imaginary line parallel to the Z direction, when comparison is made between the cross section of the pixel cell 301a taken along the line D-D' and in the cross section of the pixel cell 301b taken along the line E-E'.

As clarified above, the MOS-type solid state imaging device according to Embodiment 2 ensures data reading at a faster speed as compared with the conventional structure, while reliably suppressing occurrences of crosstalk. In addition, the above effect is achieved with the structure in which the difference in property between the pixel cells 301a and 301b is kept to a minimum.

<Modification 2>

Figure 19:
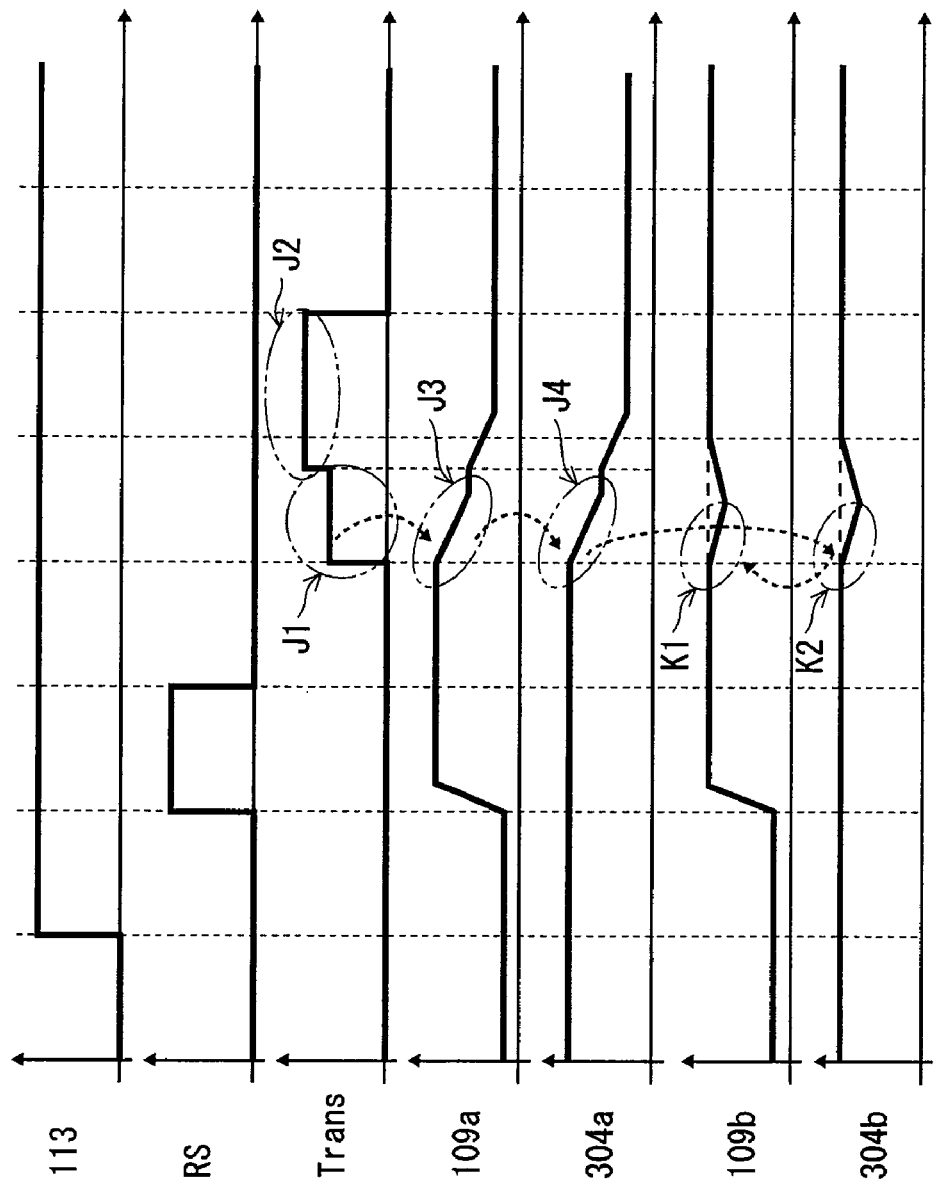
FIG. 19 is a timing chart showing the driving of a MOS-type solid state imaging device according to Modification 2 of the present invention.

The following describes the driving of a MOS-type solid state imaging device according to Modification 2 of the present invention, with reference to FIG. 19. Note that the MOS-type solid state imaging device according to Modification 2 is basically identical in structure to the MOS-type solid state imaging device according to Embodiment 2, except for the functional unit relating to control of the driving operations. Thus no further description is given here.

As shown in FIG. 19, one feature of the driving of the MOS-type solid state imaging device according to Modification 2 lies in that the signal potential of the transfer control signal line Trans is raised in two steps, first to the intermediate potential level (part indicated by an arrow J1) and then to the ON state (part indicated by an arrow J2).

At the stage when the transfer control signal line Trans is raised to the intermediate potential level (part indicated by the arrow J1), the electric charge having been generated and accumulated by the photodiode 108a is transferred to the charge storage portion 109a, while part of the electric charge remains in the photodiode without being transferred. By virtue of this arrangement, the amount of change in the potential level of the charge storage portion 109a is kept smaller than that responsive to when the signal potential of the transfer control signal line Trans is brought to the ON state in a single step as in the driving according to Embodiment 2. Consequently, the amount of change in the potential level of the output signal line 304 associated with parasitic capacitance is made smaller (part indicated by an arrow K2), which in turn serves to reduce the amount of change in the potential level of the charge storage portion 109b (part indicated by an arrow K1).

Next, when the signal potential of the transfer control signal line Trans reaches the ON state (part indicated by the arrow J2), the residual electric charge remaining in the photodiode 108*a* is transferred to the charge storage portion 109*a*. At this time, the amount of change that the potential level of the charge storage portion 109*a* undergoes is smaller, so that the amount of change in the potential level of the charge storage portion 109*b* associated with parasitic capacitance is also made smaller.

As described above, the MOS-type solid state imaging device according to Modification 2 is driven by changing the signal potential of the transfer control signal line Trans to the ON state in two steps, which enables the charge storage portion 109*b* in the pixel cells 301*b* to restore the potential level more promptly. Thus, with the MOS-type solid state imaging device according to Modification 2,
the time period during which the signal potential of the transfer control signal line Trans needs to be maintained at the ON state is shorter, so that the data reading is carried out at a higher speed.

Embodiment 3

The following describes the structure of a MOS-type solid state imaging device according to Embodiment 3, with reference to FIG. 20A. Note that the pixel cells 101*a* and 101*b* are respectively identical in structure to the pixel cells 101*a* and 101*b* of the MOS-type solid state imaging device according to Embodiment 1. In addition, the output signal lines 104*a* and 104*b* and other components are identical in structure to the corresponding components described above. Thus, those identical or similar components are not shown in the figures.

As shown in FIG. 20A, the MOS-type solid state imaging device according to Embodiment 3 has such an imaging region in which the pixel cells 101*a* and the pixel cells 101*b* are alternately disposed in the Y direction. In the X direction, on the other hand, each pixel cell 101*a* is adjacent to another pixel cell 101*a*, and each pixel cell 101*b* is adjacent to another pixel cell 101*b*.

With the above described arrangement of the pixel cells 101*a* and 101*b*, the MOS-type solid state imaging device according to Embodiment 3 achieves the effect that is similar to the effect achieved by the MOS-type solid state imaging device according to Embodiment 1.

Embodiment 4

The following describes the structure of a MOS-type solid state imaging device according to Embodiment 4, with reference to FIG. 20B. The pixel cells 101*a* and 101*b* are respectively identical in structure to the pixel cells 101*a* and 101*b* of the MOS-type solid state imaging device according to Embodiment 1. In addition, the output signal lines 104*a* and 104*b* and other components are identical in structure to the corresponding components described above. Thus, those identical or similar components are not shown in the figures.

As shown in FIG. 20B, the MOS-type solid state imaging device according to Embodiment 4 has such an imaging region in which the pixel cells 101*a* and the pixel cells 101*b* are alternately disposed in the X direction as well as in the Y direction.

With the above described arrangement of the pixel cells 101*a* and 101*b*, the MOS-type solid state imaging device according to Embodiment 4 achieves the effect that is similar to the effect achieved by the MOS-type solid state imaging devices according to Embodiments 1 and 3.

Embodiment 5

Figure 21:
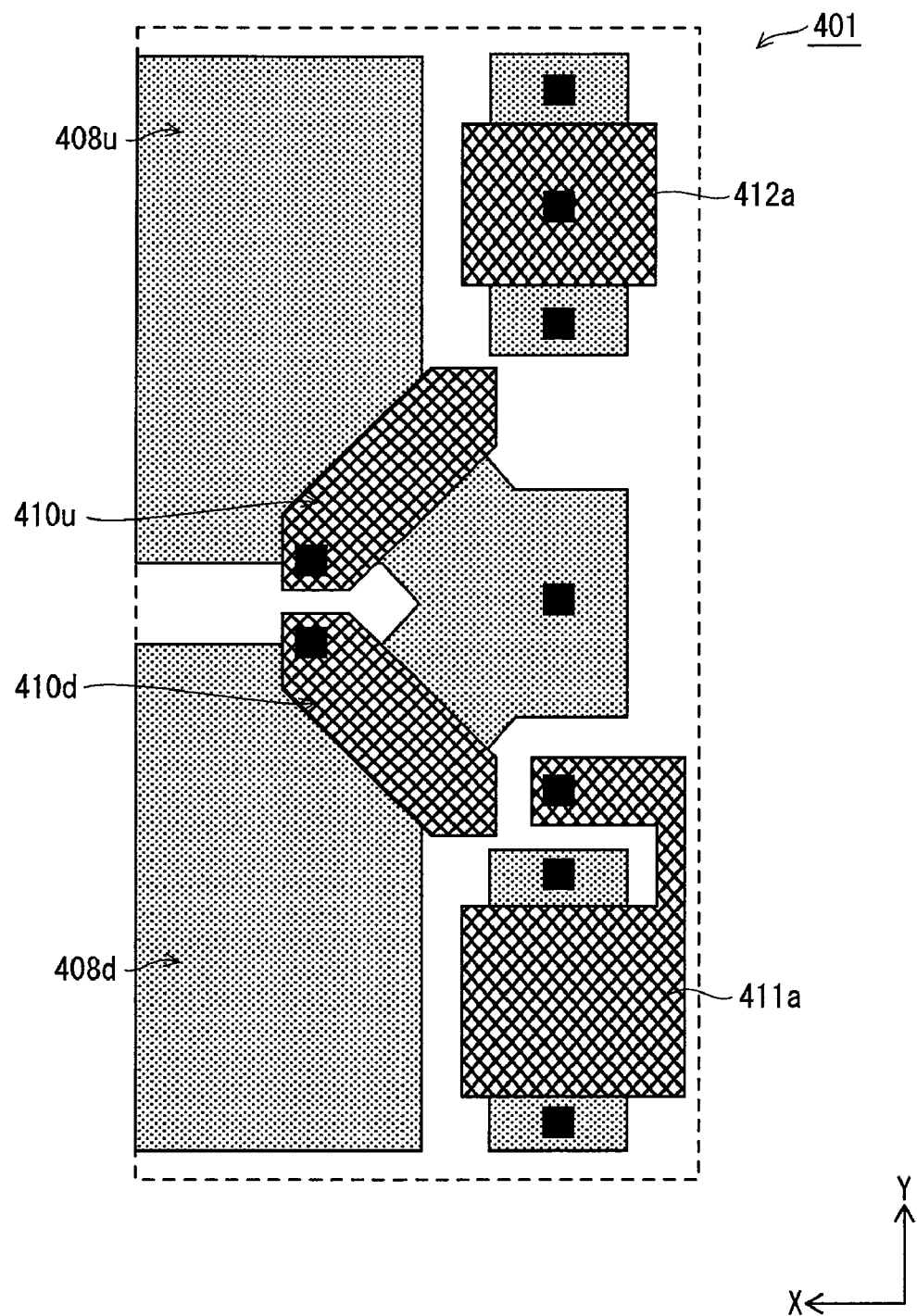
FIG. 21 is a layout drawing showing a part of a pixel cell 401 of a MOS-type solid state imaging device according to Embodiment 5 of the present invention.

The following describes the structure of a MOS-type solid state imaging device according to Embodiment 5, with reference to FIGS. 21-24. As shown in FIG. 21, the MOS-type solid state imaging device according to Embodiment 5 is in a so-called "2-pixel 1-cell structure" in which one pixel cell 401 has two photodiodes 408*u* and 408*d* and two transfer transistors 410*u* and 410*d*.

As shown in FIG. 21, in the pixel cell 401, the photodiode 408*u* is located above the photodiode 408*d* in the Y direction. The pixel cell 401 also includes transfer transistors 410*u* and 410*d* connected to the photodiodes 408*u* and 408*d*, respectively.

The pixel cell 401 also includes a reset transistor 412*a* and an amplification transistor 411*a* that are disposed to the right, in the X direction, of the photodiodes 408*u* and 408*d*, respectively. That is, the amplification transistor 411*a* is located below the reset transistor 412*a* in the Y direction.

Figure 22:
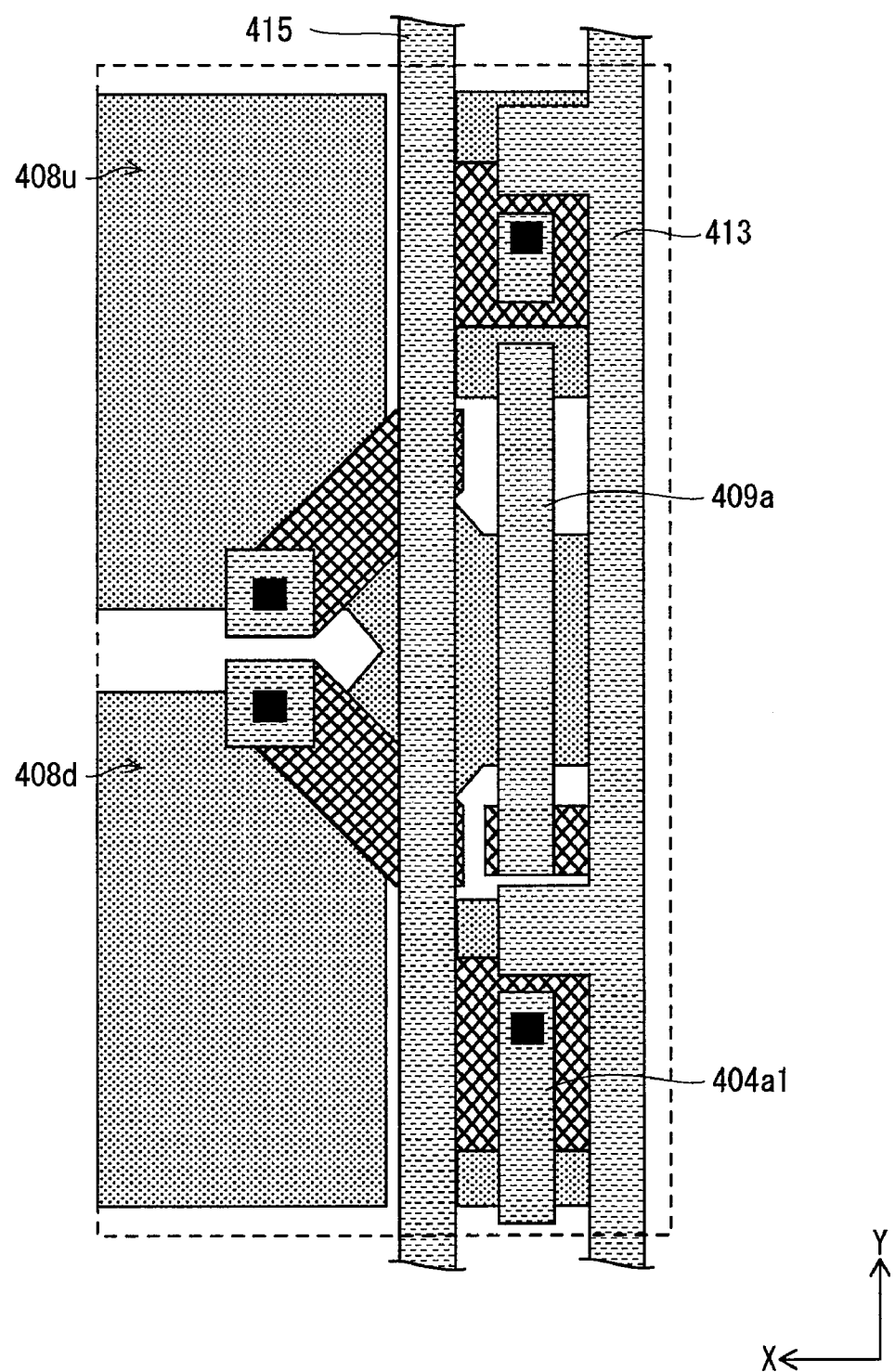
FIG. 22 is a layout drawing showing another part of the pixel cell 401 of the MOS-type solid state imaging device according to Embodiment 5.

Next, as shown in FIG. 22, a first layer 404*a*1 of an output signal line, a charge storage portion 409*a*, a pixel selecting line 413, and a dummy line 415 are disposed to partly cover the amplification transistor 411*a* and the reset transistor 412*a* from above. The first layer 404*a*1 of the output signal line, the charge storage portion 409*a*, the pixel selecting line 413, and the dummy line 415 are disposed to extend in the Y direction and in parallel relation to each other.

Figure 23:
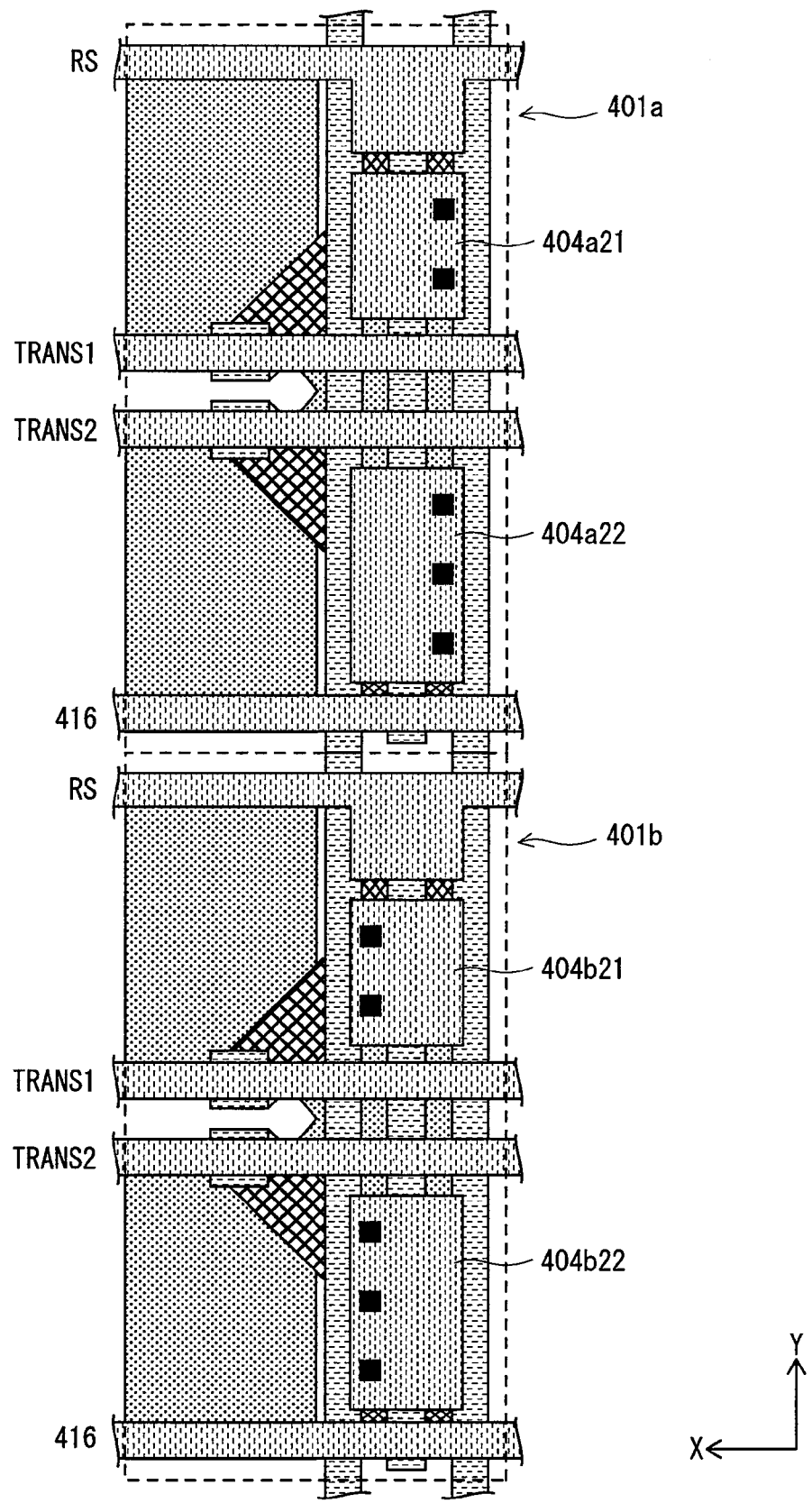
FIG. 23 is a layout drawing showing yet another part of pixel cells 401a and 401b of the MOS-type solid state imaging device according to Embodiment 5.

In FIG. 23, a pixel cell 401*a* is disposed above a pixel cell 401*b* in the Y direction. The pixel cells 401*a* and 401*b* each have the lower layers of the layout shown in FIG. 22.

In the pixel cell 401*a*, second layers 404*a*21 and 404*a*22 of the output signal line are disposed to partly cover, from above, the charge storage portion 409*a* as well as the first layer 404*a*1 of the output signal line. Similarly, in the pixel cell 401*b*, second layers 404*b*21 and 404*b*22 of an output signal line are disposed to partly cover, from above, a charge storage portion 409*b* as well as a first layer 404*b*1 of the output signal line. Note that the charge storage portion 409*b* is identical in structure to the charge storage portion 409*a* shown in FIG. 22. In addition, the first layer 404*b*1 of the output signal line is identical in structure to the first layer 404*a*1 of the output signal line shown in FIG. 22.

In addition, as shown in FIG. 23, transfer control signal lines Trans 1 and Trans 2, reset signal lines RS, and dummy lines 416 are disposed to extend in the X direction across a corresponding one of the pixel cells 401*a* and 401*b*. In addition, each of the second layers 404*a*21, 404*a*22, 404*b*21, and 404*b*22 of the respective output signal lines includes contact plugs. The contact plugs located in the pixel cells 401*a* are offset from (i.e., out of alignment with) the contact plugs located in pixel cells 401*b*, with respect to the X direction.

Figure 24:
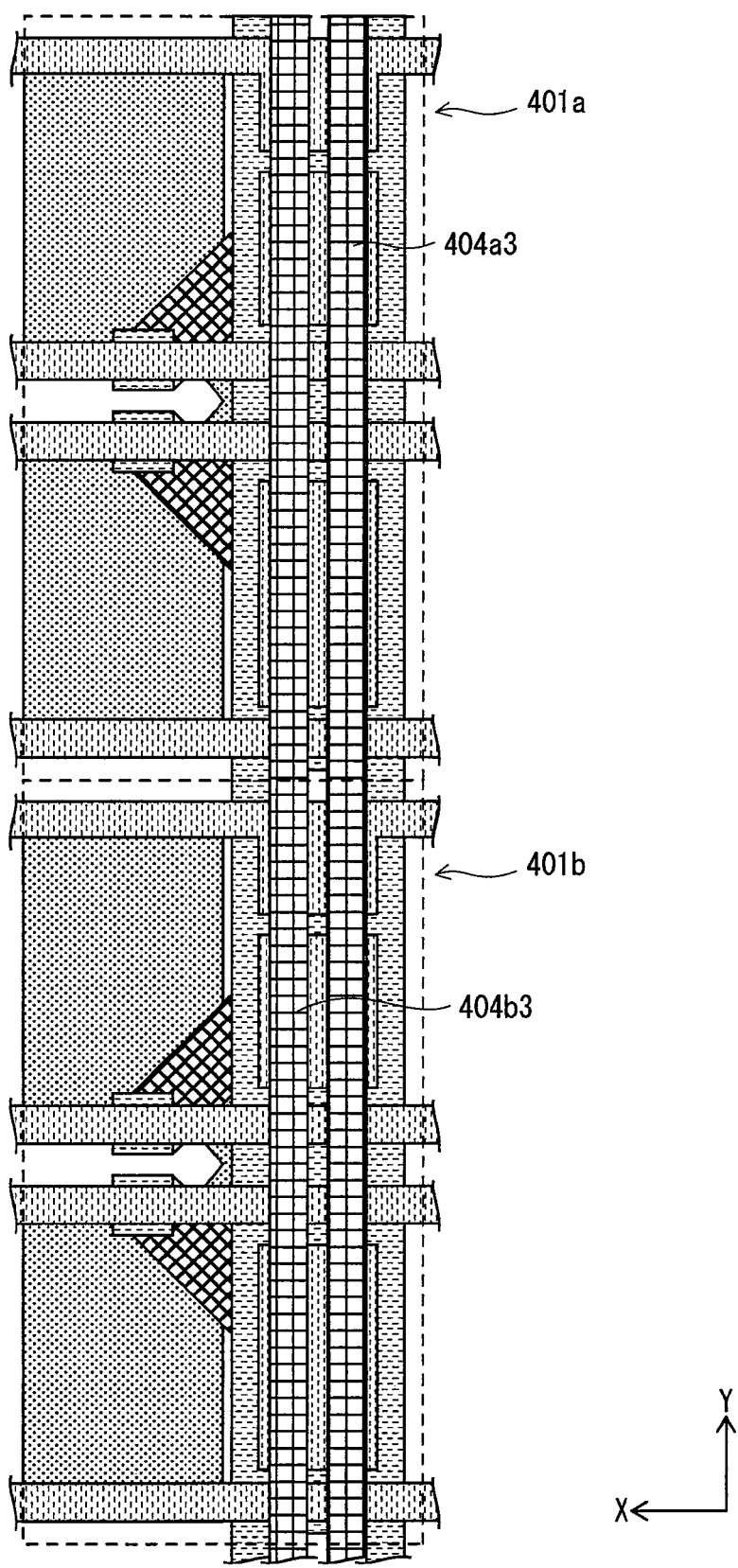
FIG. 24 is a layout drawing showing yet another part of the pixel cells 401a and 401b of the MOS-type solid state imaging device according to Embodiment 5.

As shown in FIG. 24, third layers 404*a*3 and 404*b*3 of the two output signal lines are disposed in parallel to each other above the second layers 404*a*21, 404*a*22, 404*b*21, and 404*b*22 of the respective output signal lines. Of the respective layers of the output signal lines, the third layer 404*a*3 is connected to the second layers 404*a*21 and 404*a*22 via the corresponding contact plugs, and the third layer 404*b*3 is connected to the second layers 404*b*21 and 404*b*22 via the corresponding contact plugs.

The MOS-type solid state imaging device according to Embodiment 5 described above is in a so-called 2-pixel 1-cell structure and achieves to suppress capacitive coupling in a similar manner to the MOS-type solid state imaging device according to Embodiment 2. That is, the MOS-type solid state imaging device according to Embodiment 5 is in a 2-pixel 1-cell structure and yet capable of data reading at a higher speed while suppressing occurrences of crosstalk.

Note that the arrangement of the pixel cells 401a and 401b is not limited to those shown in FIGS. 21-24 and the cell arrangement shown in any of Embodiments 3 and 4 is applicable.

<Modification 3>

Figure 25:
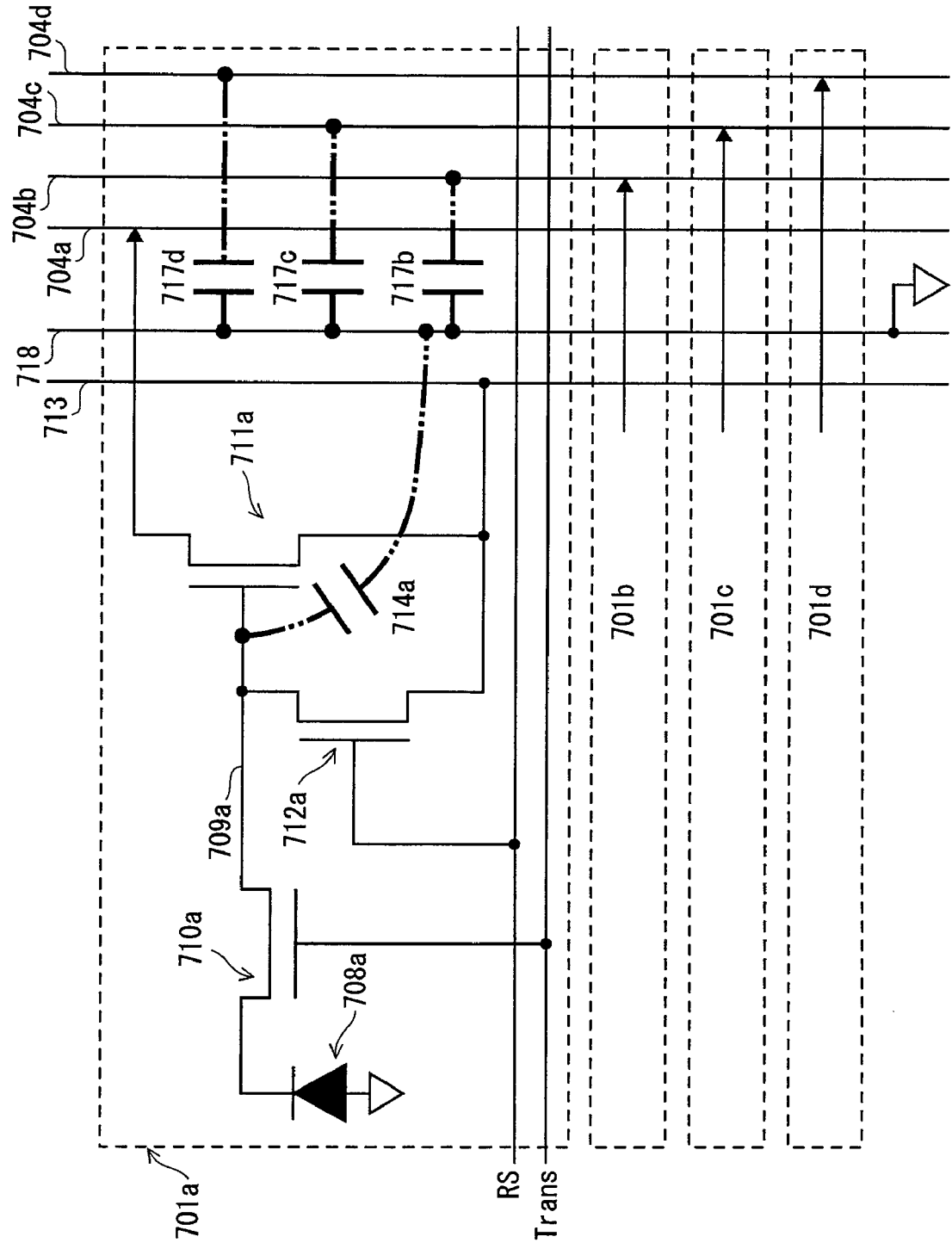
FIG. 25 is a circuit diagram showing a pixel cell 701a of a MOS-type solid state imaging device according to Modification 3 of the present invention.

The following describes the structure of the MOS-type solid state imaging device according to Modification 3, with reference to FIG. 25. Note that the MOS-type solid state imaging device according to Modification 3 is identical in structure to the MOS-type solid state imaging device 1 according to Embodiment 1, except for the structure of the pixel region. Thus, no further illustration and description thereof is given here.

As shown in FIG. 25, the MOS-type solid state imaging device according to Modification 3 has four output signal lines 704a, 704b, 704c, and 704d that are provided for a plurality of pixel cells adjacent on the same column. In addition, a pixel selecting line 713 and a conductive layer 718 are provided for the plurality of pixel cells adjacent on the same column. The output signal lines 704a, 704b, 704c, and 704d are disposed to extend in parallel to each other and each at such a location to sandwich the pixel selecting line 713 and the conductive layer 718, with charge storage portions 709a . . . of the respective pixel cells 701a-701d. Similarly to the MOS-type solid state imaging device 1 according to Embodiment 1, the conductive layer 718 is grounded to be held at a fixed potential level.

In the MOS-type solid state imaging device according to Modification 3, the conductive layer 718 is grounded, so that capacitive coupling in the pixel cell 701a, as well as in the other pixel cells 701b, 701c, and 701d, is suppressed. For example, in the pixel cell 701a, the parasitic capacitance 714a between the conductive layer 718 and the charge storage portion 709a is affected little or not at all by the potential levels of the output signal lines 704b, 704c, 704d connected to the other pixel cells, so that parasitic coupling is suppressed.

In addition, since four output signal lines 704a, 704b, 704c, and 704d are provided for each column of the pixel region, the MOS-type solid state imaging device according to Modification 3 is capable of reading data concurrently from the four pixel cells 701a, 701b, 701c, and 701d, while effectively suppressing occurrences of crosstalk.

Note that the MOS-type solid state imaging device may be modified to have n output signal lines (where n is an integer greater than or equal to 1) per column to allow simultaneous data reading from n pixel cells that are adjacent on the same columns.

<Supplementary Remarks>

The specific MOS-type solid state imaging devices described above are exemplary only for the purpose of illustrating the structures and effects achieved by the structures of the present invention. The present invention is in no way limited to Embodiments 1-5 and Modifications 1-3, so long as not departing from the gist of the present invention.

For example, according to the above description, one conductive layer is disposed to extend in parallel to the charge storage portions of the respective pixel cells adjacent on the same column. However, the present invention is not limited thereto. Specifically, for example, the solid state image forming device according to the present invention may have, for each column of pixels, a conductive layer that are divided into a plurality of pieces rather than a single integral piece of conductive layer. Preferably, in this case, the interval between pieces of the conductive layer is larger than the thickness t of the second layer 304b2 of the output signal line shown in FIG. 17, and smaller than the distance h1 between the charge storage portion 109b and the second layer 304b2 of the output signal line as well as than the distance h2 between the second and third layers 304b2 and 304a3 of the output signal line. This is to suppress parasitic capacitance between the charge storage portion of one pixel cell and the output signal line connected to another pixel cell.

Optionally, the width of the second layer of the output signal line (i.e., conductive layer) may be set wider than that according to Embodiments 1-5 and Modifications 1-3, so that it is no longer necessary to provide a separate conductive layer extending parallel to the charge storage portions.

In addition, according to Embodiments 1-5 and Modifications 1-3, the plurality of pixel cells in the pixel region are arranged in an array. However, the present invention is not limited to that the plurality of pixel cells are disposed in an array. Alternatively, for example, the plurality of pixel cells may be disposed in a honeycomb arrangement.

In addition, according to Embodiments 1-5 and Modifications 1-3, data of adjacent pixel cells are described to be read "concurrently" or "simultaneously". However, data may be read "in parallel", which means the time periods during which respective pieces of data are read from the adjacent pixel cells overlap at least partially.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A solid state imaging device having a pixel region in which a plurality of pixel cells are disposed in a matrix, the solid state imaging device comprising:
   a plurality of photodiodes each disposed in a different one of the pixel cells and operable to perform photoelectric conversion; and
   a plurality of charge storage portions each disposed in a different one of the pixel cells and operable to store a signal charge generated by a corresponding one of the photodiodes, wherein
   the pixel cells include a first pixel cell and a second pixel cell that are adjacent to each other on a same column,
   the solid state imaging device further comprises:
   a first output signal line and a second output signal line disposed in parallel to each other and adjacent to both the charge storage portions of the first and second pixel cells; and
   a conductive layer disposed between the charge storage portion of the first pixel cell and the second output signal line to suppress capacitive coupling therebetween,
   a signal voltage indicative of a signal charge stored in the charge storage portion of the first pixel cell is output to the first output signal line,
   a signal voltage indicative of a signal charge stored in the charge storage portion of the second pixel cell is output to the second output signal line, and
   the output to the first output signal line is made in parallel with the output to the second output signal line.

2. The solid state imaging device according to claim 1, wherein
   the conductive layer is maintained at a fixed potential.

3. The solid state imaging device according to claim 1, wherein
   the conductive layer is grounded.

4. The solid state imaging device according to claim 1, wherein
the conductive layer is connected to the first output signal line.

5. The solid state imaging device according to claim 4, further comprising:
a second conductive layer disposed between the charge storage portion of the second pixel cell and the first output signal to suppress capacitive coupling therebetween, wherein
the second conductive layer is connected to the second output signal line.

6. The solid state imaging device according to claim 1, further comprising:
an insulating film; and
a pair of contact plugs each disposed in a different one of the first and second pixel cells and to extend through the insulating film, wherein
in a direction intersecting a plane along which the pixel cells are disposed, the first and second output signal lines are (i) located above the charge storage portions of the first and second pixel cells via the insulating film, and (ii) each connected to the charge storage portion of a corresponding one of the first and second pixel cells via a corresponding one of the contact plugs, and
the first and second pixel cells are identical in plan view, except for the locations of the contact plugs.

7. The solid state imaging device according to claim 6, wherein
the charge storage portions of the first and second pixel cells each have a line portion that extends in parallel to both the first and second output signal lines, and with respect to an imaginary line extending in parallel to the line portions, the contact plug connecting the first output signal line to the charge storage portion of the first pixel cell is disposed in symmetric relation to the contact plug connecting the second output signal line to the charge storage portion of the second pixel cell.

8. The solid state imaging device according to claim 1, wherein
the first and second pixel cells each include, in addition to the photodiode and the charge storage portion:
a transfer transistor operable to transfer the signal charge generated by the photodiode to the charge storage portion, based on a transfer control signal received;
a reset transistor operable to reset a potential of the charge storage portion, based on a reset control signal received; and
an amplification transistor operable to amplify the signal charge transferred to the charge storage portion and output the amplified signal charge to a corresponding one of the first and second output signal lines.

9. The solid state imaging device according to claim 8, wherein
each photodiode disposed in the first and second pixel cells comprises two photodiodes, and
the first and second pixel cells share the one amplification transistor and the one reset transistor.

10. The solid state imaging device according to claim 8, wherein
the transfer control signal input to the transfer transistor is raised in multiples steps to multiple voltage levels before reaching to an ON state.

\* \* \* \* \*